US007792181B2

(12) United States Patent
Yamanouchi et al.

(10) Patent No.: US 7,792,181 B2
(45) Date of Patent: Sep. 7, 2010

(54) LINEARITY EVALUATION METHOD USING INTEGRATIONS WEIGHTED BY PROBABILITY DENSITY FUNCTION, AND CIRCUIT SIMULATOR, EVALUATION DEVICE, COMMUNICATION CIRCUIT, AND PROGRAM USING THE METHOD

(75) Inventors: Shingo Yamanouchi, Tokyo (JP); Kazuaki Kunihiro, Tokyo (JP)

(73) Assignee: NEC Corporation, Tokyo (JP)

( * ) Notice: Subject to any disclaimer, the term of this patent is extended or adjusted under 35 U.S.C. 154(b) by 824 days.

(21) Appl. No.: 11/571,247

(22) PCT Filed: Jun. 13, 2005

(86) PCT No.: PCT/JP2005/010768

§ 371 (c)(1),
(2), (4) Date: Dec. 22, 2006

(87) PCT Pub. No.: WO2006/001184

PCT Pub. Date: Jan. 5, 2006

(65) Prior Publication Data

US 2008/0019433 A1 Jan. 24, 2008

(30) Foreign Application Priority Data

Jun. 23, 2004 (JP) ............................. 2004-185105

(51) Int. Cl.
*H04B 3/46* (2006.01)
(52) U.S. Cl. .................................................. 375/224
(58) Field of Classification Search ................. 324/513, 324/523, 527, 528, 750, 755, 763, 765; 375/224, 375/225, 226, 227, 228; 370/247, 251; 379/21, 379/26.02, 27.04; 700/39, 81; 702/120, 702/121; 714/30, 36, 715, 734, 738
See application file for complete search history.

(56) References Cited

U.S. PATENT DOCUMENTS 6,192,227 B1 * 2/2001 Tenny ........................ 455/295
7,339,983 B2 * 3/2008 Kim et al. ................... 375/224

FOREIGN PATENT DOCUMENTS

| JP | 9-83602 | 3/1997 |
|---|---|---|
| JP | 9-270776 | 10/1997 |
| JP | 2002-009642 | 1/2002 |
| JP | 2003-188656 | 7/2003 |
| JP | 2003-209584 | 7/2003 |
| JP | 2003-258560 | 9/2003 |
| JP | 2003-332923 | 11/2003 |
| JP | 2004-056499 | 2/2004 |

OTHER PUBLICATIONS

Chen et al., A New Hybrid Generalized Selection Combining Scheme and Its Performance over Fading Channels, WCNC 2004/ IEEE Communications Society, p. 926-931.*
Michael S. Heutmaker, "The Error Vector and Power Amplifier Distortion", IEEE Wireless Communications Conference, pp. 100-104 (1997).

(Continued)

*Primary Examiner*—Sam K Ahn
(74) *Attorney, Agent, or Firm*—Dickstein, Shapiro, LLP.

(57) ABSTRACT

An evaluation method for linearity evaluations neither performing calculations of error vectors at multiple sampling points nor using a demodulator corresponding to a desired modulation scheme. Measuring devices (164 and 165) measure the input signal and the output signal of an evaluation object (1), to which a predetermined evaluation signal has been inputted. An evaluation unit (166) uses the input signal and the output signal of the evaluation object (1), to determine at least one of an amplitude distortion or a phase distortion of the output signal. An integration unit (169) uses the distortions to perform the integrations weighted by the probability density function of the power-to-average ratio of a predetermined modulated signal. A linearity index calculation unit (170) calculates a linearity index from the results of processing by the integration unit (169).

16 Claims, 25 Drawing Sheets

OTHER PUBLICATIONS

Patrick Naraine, "Predicting the EVM Performance of WLAN Power Amplifiers with OFDM Signals", MicroWave Journal (May 2004).

Yamanouchi et al., "An Efficient Algorithm for Simulating Error Vector Magnitude in Nonlinear OFDM Amplifiers" (System Devices Research Laboratories, NEC Corporation, 34 Miyukigaoka, Tsukuba, Ibaraki 305-8501, Japan, 2004.

Article "Steve C. Cripps, Predistortion Techniques" Advanced Techniques in RF Power Amplifier Design, Artech House, pp. 153-195 (2002).

* cited by examiner

LINEARITY EVALUATION METHOD USING INTEGRATIONS WEIGHTED BY PROBABILITY DENSITY FUNCTION, AND CIRCUIT SIMULATOR, EVALUATION DEVICE, COMMUNICATION CIRCUIT, AND PROGRAM USING THE METHOD

Linearity evaluation method using integrations weighted by probability density function, and circuit simulator, evaluation device, communication circuit, and program using the method

TECHNICAL FIELD

The present invention relates to the evaluation of a linearity index of a circuit, and more particularly to the evaluation of an error vector magnitude which serves as a linearity index.

BACKGROUND ART

In the art of radio communications, transmission power amplifiers are required to have higher linearity for higher-rate and larger-capacity communications. Requirements for linearity are determined according to the standards of various communication processes. One important linearity index employed in those standards is called error vector magnitude (EVM).

FIG. 1 is a diagram showing an example of a general demodulated signal. FIG. 1 shows ideal symbol 11, measured symbol 12, and error vector 13. Error vector 13 represents the difference between measured symbol 12 and ideal symbol 11.

The square mean of error vectors 13 of a plurality of sampled data is standardized by the average power $P_0$ of ideal symbol 11, and an EVM is defined as the square root of the standardized value. If measured symbol 12 is represented as vector quantity c' and ideal symbol 11 as vector quantity c, then the EVM value is expressed by the equation (1) shown below. In the equation (1), k is a variable representing a sample number, and N the number of samples.

$$EVM = \sqrt{\frac{1}{P_0 N} \sum_{k=1}^{N} |c'(k) - c(k)|^2} \quad (1)$$

Limit values for the EVM are directly or indirectly determined according to the communication standards. For example, IEEE Std. 802.11a, Part 11: wireless LAN Medium Access Control (MAC) and Physical Layer (PHY) specifications: High-speed physical layer in the 5 GHz band, pp. 29, 1999 specifies that a relative constellation error in a communication mode of 54 Mbps shall be −25 dB or less. The relative constellation error of −25 dB or less is equivalent to an EVM value of 5.6% (=100×10$^{(-25/20)}$%) or less.

GSM 05.05 V8.2.0—Digital cellular telecommunications system (phase 2+); radio transmission and reception, pp. 27, SEPTEMBER, 2000 specifies that with respect to EVM values in EDGE which is one of cellular phone standards, terminal devices shall satisfy an EVM value of 9% or less and base stations shall satisfy an EVM value of 7% or less.

FIG. 2 is a flowchart of a sequence according to a conventional general EVM evaluating method. As shown in FIG. 2, according to the conventional EVM evaluating method, a modulated signal is input to a system under test (step A1), and the modulated signal output from the system under test is measured (step A2). Then, the modulated signal is demodulated (step A3), and an error vector is extracted from the demodulated signal (step A4). The demodulated signal and the error vector are acquired at a plurality of sampling points.

Then, an average value of error vector power levels obtained at the respective sampling points is determined (step A5). Then, the average value of error vector power levels is divided by the average power level of an ideal demodulated signal, and the square root of the quotient is calculated as an EVM value (step A6).

The evaluation of the EVM value is completed according to the above process. However, if necessary, the evaluation of an EVM value may be repeated (step A7). For example, a parameter such as an average power level of the input modulated signal or a biasing condition for the system under test may be changed, and an EVM value may be evaluated according to the same process. Alternatively, the measurement may be repeated without changing the parameter.

A conventional circuit simulator, a conventional evaluating device, and a conventional EVM evaluating method for a communication circuit to be described below are basically based on the method shown in FIG. 2.

FIG. 3 is a block diagram showing an arrangement of a conventional circuit simulator with a function to calculate an EVM value. As shown in FIG. 3, the conventional circuit simulator has input unit 31, storage unit 33, data processor 34, and output unit 35.

Input unit 31 is a unit that is operable for entering information such as various data, etc., and may be a keyboard, for example. Storage unit 33 has modulating process storage 27, system-under-test storage 28, demodulating process storage 29, and extracted error vector storage 30. Modulating process storage 27 stores information of a modulating process that is entered from input unit 31. System-under-test storage 28 stores information of a system under test that is entered from input unit 31. Demodulating process storage 29 stores information of a demodulating process that is entered from input unit 31. Extracted error vector storage 30 stores information of an error vector that is extracted by data processor 34.

Data processor 34 performs a predetermined simulating process by executing a program. Data processor 34 realizes an arrangement having modulated signal generator 21, system-under-test model 1a, modulated signal evaluator 22, demodulator 23, error vector extractor 24, error vector averager 25, and EVM value calculator 26.

Output unit 35 is a unit for outputting information from data processor 34, and may be a display unit or a printer, for example. Output unit 35 has EVM value display 32.

The circuit simulator shown in FIG. 3 operates as follows: First, a modulating process is selected, and information of a model which reproduces operation of a generator for generating a modulated signal according to the modulating process is entered through input unit 31. The entered information about the modulating process is stored in modulating process storage 27. Information of a model which reproduces operation of a system under test is also entered through input unit 31. The entered information of the model of the system under test is stored in system-under-test storage 28. Information of a model of a demodulator based on a demodulating process which corresponds to the selected modulating process is entered through input unit 31. The entered information is stored in demodulating process storage 29.

Modulated signal generator 21 generates a numerical modulated signal based on the information stored in modulating process storage 27. The generated modulated signal is input to system-under-test model 1a.

Based on the information of the model of the system under test which is stored in system-under-test storage 28, systemunder-test model 1*a* performs a predetermined numerical calculation on the modulated signal output from modulated signal generator 21.

Modulated signal evaluator 22 evaluates the calculation that has been performed on the modulated signal by system-under-test model 1*a*. Demodulator 23 demodulates the modulated signal evaluated by modulated signal evaluator 22, based on the model of the demodulator stored in demodulating process storage 29. The modulated signal and the demodulated signal are acquired at a plurality of sampling points.

Error vector extractor 24 extracts an error vector from the demodulated signal produced by demodulator 23. Error vectors obtained at a plurality of sampling points are recorded in extracted error vector storage 30, if necessary.

Error vector averager 25 determines an average value of a plurality of error vectors extracted by error vector extractor 24.

EVM value calculator 26 calculates an EVM value by dividing the average power level of error vectors obtained by error vector averager 25 by the average power level of an ideal demodulated signal, and determining the square root of the quotient.

EVM value display 32 displays the EVM value calculated by EVM value calculator 26.

FIG. 4 is a block diagram showing an arrangement of a conventional measuring device with a function to evaluate an EVM value. As shown in FIG. 4, the conventional measuring device has modulated signal generating unit 50 and EVM value evaluating unit 51. EVM value evaluating unit 51 comprises demodulator 42, error vector extracting circuit 43, error vector averaging circuit 44, EVM value calculating circuit 45, and EVM value display circuit 46.

Modulated signal generator 41 generates a modulated signal and inputs the modulated signal to system 1 under test. Average power levels of modulated signals that are input to and output from system 1 under test are supplied respectively through couplers 47*a*, 47*b* and evaluated respectively by input power measuring unit 48 and output power measuring unit 49.

Demodulator 42 demodulates the modulated signal output from system 1 under test. Error vector extracting circuit 43 extracts error vectors from the demodulated signal.

Error vector averaging circuit 44 determines an average power of the error vectors. EVM value calculating circuit 45 divides the average power of the error vectors which has been obtained by error vector averaging circuit 44, by the average power level of an ideal demodulated signal according to the equation (1), and calculates the square root of the quotient as an EVM value. EVM value display circuit 46 displays the obtained EVM value.

The processing sequence from the demodulation to the display of the EVM value is carried out by EVM value evaluating unit 51.

FIG. 5 is a block diagram of a conventional reception circuit having a function to select a reception mode based on the evaluated EVM value. For example, JP-A No. 2004-56499 discloses a reception circuit having a mode selecting function as shown in FIG. 5. As shown in FIG. 5, reception circuit 87 comprises two antennas 81*a*, 81*b* corresponding to different reception modes, and two demodulators 82*a*, 82*b*. Antennas 81*a*, 81*b* receive modulated signals, and demodulators 82*a*, 82*b* demodulate the modulated signals. The demodulated signals from respective demodulators 82*a*, 82*b* are transmitted to received baseband signal processing circuit 83.

Received baseband signal processing circuit 83 processes the demodulated signals according to a predetermined signal processing process, and sends the processed demodulated signals to error vector extracting circuit 84. Error vector extracting circuit 84 extracts error vectors from the demodulated signals. Error vector averaging circuit 85 determines average power levels of the error vectors extracted by error vector extracting circuit 84.

Control circuit 86 calculates EVM values in the different reception modes received by the respective antennas 81*a*, 81*b*, from the average power levels according to the equation (1), compares the EVM values, and selects the reception mode with the lower EVM value for better signal quality.

FIG. 6 is a block diagram showing an arrangement of a conventional transmission/reception circuit having a function to generate a modulated signal for correcting a distortion of a system under test, based on the evaluated error vector. For example, JP-A No. 2002-9642 discloses a transmission/reception circuit having a function to correct a distortion-induced error as shown in FIG. 6. As shown in FIG. 6, transmitting/receiving circuit 69 comprises system 1 under test, modulated signal generator 61, control circuit 62, coupler 63, demodulator 64, error vector extracting circuit 65, received baseband signal processing circuit 66, and switcher 67.

During a period for performing an error control process, control circuit 62 controls switcher 67 to connect a path from system 1 under test to coupler 63. A modulated signal output from system 1 under test is now transmitted to demodulator 64.

Demodulator 64 demodulates the output modulated signal. Error vector extracting circuit 65 extracts an error vector from the demodulated signal from demodulator 64, and corrects a parameter of modulated signal generator 61 in order to minimize the error vector, based on the information of the extracted error vector.

When transmission/reception circuit 69 operates as described above, it corrects the error vector due to a distortion of system 1 under test for thereby improving the linearity thereof.

During a period for not performing the error control process, control circuit 62 controls switcher 67 to disconnect the path from system 1 under test to coupler 63. Now, conventional transmission/reception circuit 69 performs a transmission mode of operation using modulated signal generator 61, system 1 under test, and antenna 68 and a reception mode of operation using antenna 68, demodulator 64, and received baseband signal processing circuit 66.

The circuit shown in FIG. 6 serves to correct the distortion based on the error vector. However, the distortion can be corrected without using the error vector of the demodulated signal if an amplitude distortion and a phase distortion of the system under test can be measured. FIG. 7 is a block diagram showing an arrangement of a conventional circuit having a function to correct a distortion of a system under test.

For example, JP-A No. 2003-258560 discloses a circuit having a distortion correcting function as shown in FIG. 7. As shown in FIG. 7, the circuit comprises couplers 101*a*, 101*b*, delay circuit 102, square detecting circuit 103, A/D converter 104, table 105, D/A converters 106, 115, low-pass filters 107*a*, 107*b*, phase circuit 108, amplitude circuit 109, amplifier 110, distortion detecting circuit 112, table updating circuit 113, VCO control circuit 114, and VCO 116. A/D converter 104, table 105, D/A converters 106, 115, table updating circuit 113, VCO control circuit 114, and VCO 116 are constructed as digital processor 111.

An input signal divided by coupler 101*a* and detected by square detecting circuit 103 and an output signal divided by coupler 101b and detected by distortion detecting circuit 112 are input to digital processor 111. Based on the input signal, the output signal, and data stored in table 105 for distortion compensation, digital processor 111 controls phase circuit 108 and amplitude circuit 109 for correcting a distortion of amplifier 110. Table updating circuit 113 updates the data stored in table 105 based on the output signal from distortion detecting circuit 112.

DISCLOSURE OF THE INVENTION

According to the conventional EVM evaluating method as shown in FIG. 2, it is necessary to acquire error vectors at a large number of sampling points in order to determine an average power of the error vectors. For example, the number of sampling points required to determine an EVM value according to the wireless LAN standards IEEE802.11a is represented by (the number of subcarriers)×(packet length)× (the number of frames). According to Patent Document 1, pp. 30, IEEE802.11a specifies that the number of subcarriers is 52, the packet length is 16 or greater, and the number of frames is 20 or more. Therefore, the minimum number of sampling points required is 52×16×20=16640.

The need for calculations at such many sampling points poses serious problems on the EVM evaluating method, and is responsible for the following specific problems:

For example, if an EVM value is evaluated by the circuit simulator shown in FIG. 3, then the calculation time is long because of calculations performed at many sampling points. The communication circuit shown in FIG. 5 requires a calculating circuit having a high processing capability for enabling calculations at many sampling points and a large-scale memory. Therefore, the circuit is large in scale and the power consumption thereof is high.

The conventional EVM evaluating method needs a demodulator which is complex in circuit arrangement and highly costly, and hence is responsible for the following specific problems:

If the system under test is an amplifier, and its characteristics are to be experimentally evaluated, then basic characteristics such as a gain and a saturated output are obtained from the results measured when a sine wave is input to the system. For evaluating an EVM value according to the conventional method, EVM value evaluating unit 51 including demodulator 42 shown in FIG. 4 is required in addition to the device for measuring the system when a sine wave is input to the system. The need for EVM value evaluating unit 51 leads to an increase in the cost.

Transmission/reception circuit 69 shown in FIG. 6 employs demodulator 64 for determining an error vector due to a distortion of system 1 under test included in the transmission circuit. Demodulator 64 is essentially not required in the transmission circuit, and invites an increase in the circuit scale if included for determining an error vector. In the example shown in FIG. 6, demodulator 64 in the reception circuit is used to determine an error vector of the transmission circuit. Therefore, transmission/reception circuit 69 shown in FIG. 6 is unable to perform ordinary signal receiving operation while it is correcting the error.

In order to avoid the problems caused by employing the demodulator, the circuit shown in FIG. 7 corrects a distortion of the system under test without using a demodulator corresponding to a desired modulated signal. However, because the circuit has no demodulator, it lacks any means for evaluating an EVM value, is unable to confirm whether the distortion-corrected characteristics of a desired modulated signal average power level satisfy EVM standards or not, and hence is not reliable.

The circuit sown in FIG. 7 does not have any means for determining which one of the amplitude distortion and the phase distortion greatly affects the EVM value. The lack of such means is also responsible for non-reliability of the distortion correction.

It is an object of the present invention to provide a linearity evaluation method which is capable of evaluating linearity without calculating error vectors at a number of sampling points and also without employing a demodulator corresponding to a desired modulating process, a circuit simulator, an evaluating device, a communication circuit, and a program using the linearity evaluation method.

To achieve the above object, an evaluating device according to the present invention an evaluating device for evaluating a linear index in a system under test in an electric circuit, the evaluating device having a measuring device, an evaluator, an integrator, and a linear index calculator.

The measuring device measures an input signal input to and an output signal output from the system under test to which a predetermined evaluation signal has been input.

The evaluator determines at least one of an amplitude distortion and a phase distortion of the output signal, using the input signal and the output signal. The integrator performs an integrating process weighted by a probability density function of a power/average power ratio of a predetermined modulated signal, using the one of the amplitude distortion and the phase distortion. The linear index calculator calculates the linear index from the result of the integrating process performed by the integrator.

BEST MODE FOR CARRYING OUT THE INVENTION

1st Embodiment

Figure 8:
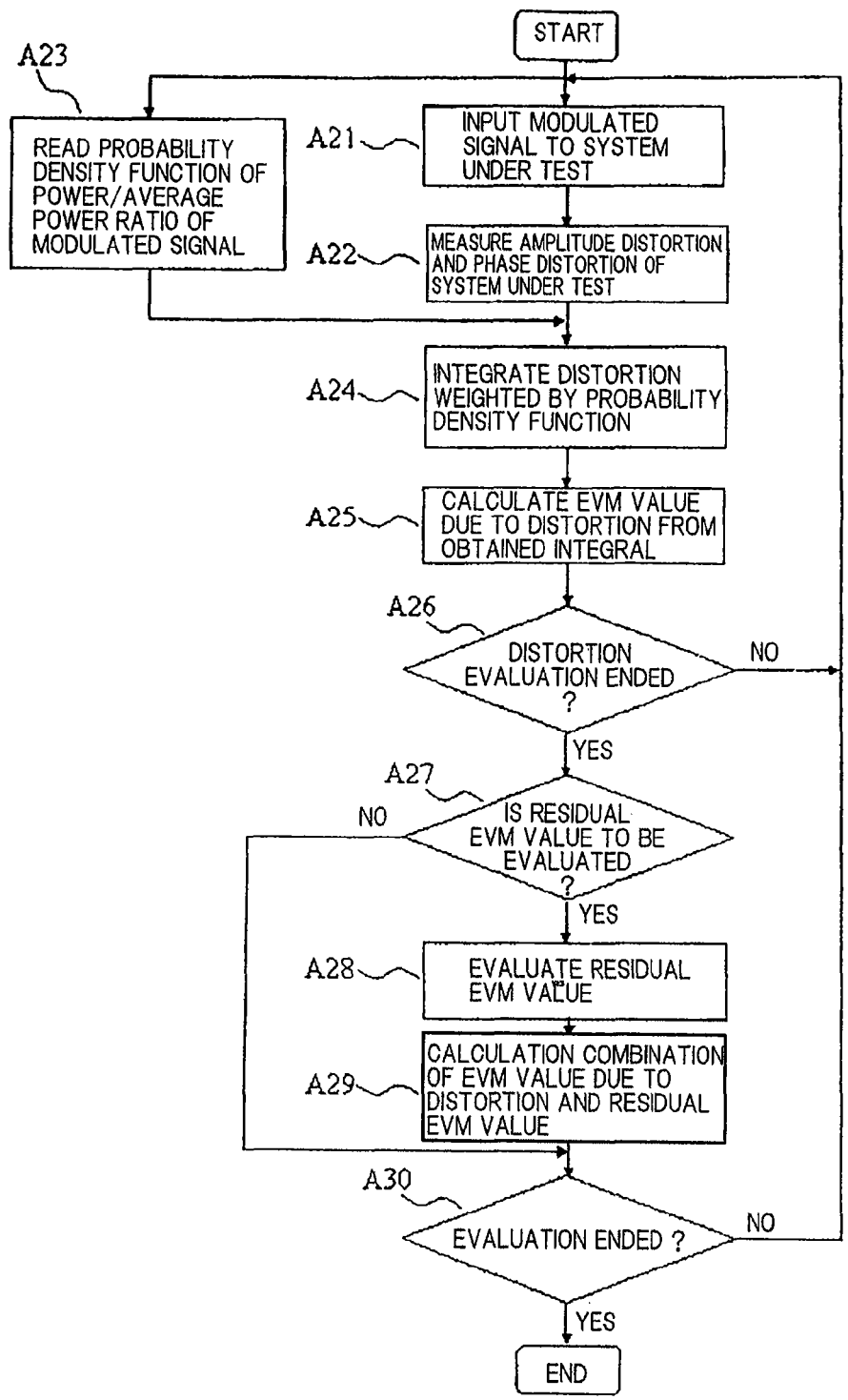
FIG. 8 is a flowchart of a sequence according to an EVM evaluating method according to a first embodiment.

FIG. 8 is a flowchart of a sequence according to an EVM evaluating method according to a first embodiment. The EVM evaluating method is a method of evaluating the EVM value of a system under test, and is of a basic nature applicable to various devices and circuits. The present method is not dependent on any particular arrangement, but is widely applicable to various arrangements. FIG. 8 shows a method of calculating an EVM value directly from the evaluated power dependency of an amplitude distortion and a phase distortion of the system under test.

As shown in FIG. 8, an evaluation signal is input to the system under test (step A21). Then, an amplitude distortion and a phase distortion of the system under test are measured (step A22). Independently of steps A21, A22, the probability density function of the power/average power ratio of a desired modulated signal is read (step A23).

The amplitude distortion and the phase distortion that have been obtained in step A22 are weighted by the probability density function obtained in step A23, and are integrated (step A24).

Then, an EVM value is calculated using the integral obtained in step A24 (step A25). Thereafter, it is determined whether the distortion evaluation is to be ended or not (step A26). If the distortion evaluation is not to be ended, then control goes back to step A21 and step A23.

If the distortion evaluation is to be ended, then it is determined whether a residual EVM value is to be evaluated or not (step A27). If a residual EVM value is to be evaluated, then the residual EVM value is evaluated (step A28). Thereafter, an EVM value representing a combination of the EVM value due to the distortion of the system under test and the residual EVM value is calculated (step A29).

If a residual EVM value is not to be evaluated in step A27, or after step A29, it is determined whether the evaluation sequence is to be ended or not (step A30). If the evaluation sequence is not to be ended, then control goes back to step A21 and step A23.

The principles of the EVM evaluating method will be described in detail below.

Figure 9:
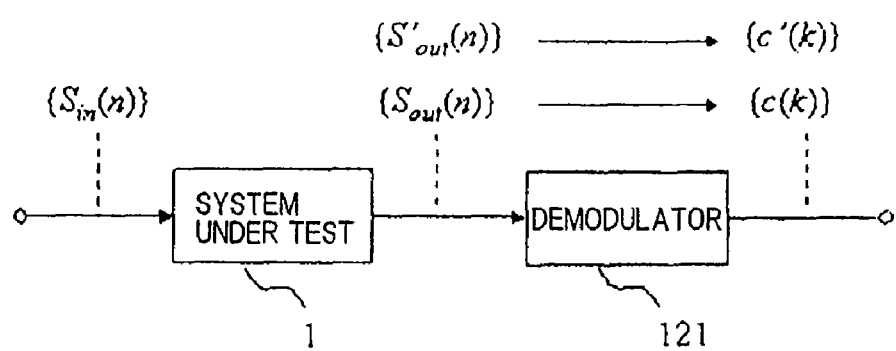
FIG. 9 is a schematic diagram of a hypothetical measuring system, which is illustrative of the definition of signals in the first embodiment.

FIG. 9 is a schematic diagram of a hypothetical measuring system, which is illustrative of the definition of signals in the first embodiment. As shown in FIG. 9, it is assumed that when a modulated signal sequence $\{S_{in}(n)\}$ is input to system 1 under test, a modulated signal sequence $\{S'_{out}(n)\}$ is output from system 1 under test. A variable n representing the sampling number of the modulated signal may be of any desired physical dimension. For example, the variable n may be a time variable or a frequency variable. Since system 1 under test generally has a characteristic distortion, the modulated signal sequence $\{S'_{out}(n)\}$ deviates from an ideal modulated signal sequence $\{S_{out}(n)\}$ that is produced if system 1 under test is distortion-free.

$S_{in}(n)$, $S_{out}(n)$, and $S'_{out}(n)$ indicate complex signals, and the power levels of the signals are obtained by squaring the absolute values of these complex signals. Specifically, the power $P_{in}(n)$ of the input modulated signal and the power $P_{out}(n)$ of the ideal output modulated signal are given respectively by the following equations (2), (3):

$$P_{in}(n)=|S_{in}(n)|^2 \quad (2)$$

$$P_{out}(n)=|S_{out}(n)|^2 \quad (3)$$

Demodulator 121 demodulates the modulated signal to produce a demodulated signal $\{c(k)\}$ from the ideal output modulated signal sequence $\{S_{out}(n)\}$ and a demodulated signal $\{c'(k)\}$ from the output modulated signal sequence $\{S'_{out}(n)\}$ affected by the distortion.

A variable k representing the sampling number of the demodulated signal may be of any desired physical dimension. For example, the variable k may be a time variable or a frequency variable.

According to the equation (1) referred to above, the EVM value is given using the ratio of the error vector average power of the demodulated signal to the ideal signal average power, i.e., the signal vs. distorted power ratio of the demodulated signal.

Generally, the error vector is generated by the distortions of both system 1 under test and demodulator 121. For the measurement purpose, attention should be focused on only the effect of the system under test, and the effect that demodulator 121 as part of the measuring system has should desirably be excluded.

Based on the approach to exclude the effect that the demodulator has on the measuring system, it is assumed here that the signal vs. distorted power ratio is not changed by the demodulator. Thus, the signal vs. distorted power ratio of the modulated signal before it is demodulated and the signal vs.

distorted power ratio of the demodulated signal are the same as each other. As a result, the equation (4) shown below is obtained. In the equation (4), the expected value of x is indicated by E[x] and the average power of the ideal modulated output by $P_{out(ave)}$.

$$EVM = \sqrt{\frac{1}{P_0 N} \sum_{k=1}^{N} |c'(k) - c(k)|^2} \qquad (4)$$

$$= \sqrt{\frac{E[|c'(k) - c(k)|^2]}{P_0}} \sqrt{\frac{E[|S'_{out}(n) - S_{out}(n)|^2]}{P_{out(ave)}}}$$

The approach to exclude the effect that the demodulator has on the measuring system in order to focus attention only on only the effect of the system under test should be applied regardless of types of modulating and demodulating processes. Therefore, the equation (4) obtained from this approach is applicable regardless of types of modulating and demodulating processes.

The relationship between an output modulated signal $S'_{out}(n)$ including a distortion-induced error and an input modulated signal $S_{in}(n)$ is expressed by the equation (5):

$$S'_{out}(n) = S_{in}(n) \cdot G(P_{in}(n)) \cdot \exp\{j\theta(P_{in}(n))\} \qquad (5)$$

Generally, the signal gain $G(P_{in}(n))$ has nonlinear characteristics such that it varies with respect to the power $P_{in}(n)$ of the input modulated signal, and the EVM value is degraded due to the nonlinear characteristics of the gain, i.e., the amplitude distortion. The power gain is given as the square of the signal gain $G(P_{in}(n))$. The unit of the power used in the definition of the gain is not [dB], but is represented by an absolute value, e.g., [W].

Generally, the phase $\theta(P_{in}(n))$ has nonlinear characteristics such that it varies with respect to the power $P_{in}(n)$ of the input modulated signal, and the EVM value is degraded due to the nonlinear characteristics of the gain, i.e., the phase distortion. The unit of the phase $\theta(P_{in}(n))$ is [rad.].

In a communication system, a reference for the gain and the phase is determined from the characteristics of the average power. In an ideal distortion-free situation, the gain and phase of the output modulated signal take values at the input modulated signal average power $P_{in(ave)}$, and do not vary with respect to the power $P_{in}(n)$ of the input modulated signal. Thus, the relationship between the ideal output modulated signal $S_{out}(n)$ and the input modulated signal $S_{in}(n)$ is expressed by the equation (6):

$$S_{out}(n) = S_{in}(n) \cdot G(P_{in(ave)}) \cdot \exp\{j\theta(P_{in(ave)})\} \qquad (6)$$

If the power/average power ratio of the ideal distortion-free modulated signal is defined as r, then a value r(n) at a sampling point is represented by the equation (7):

$$r(n) = P_{in}(n)/P_{in(ave)} = P_{out}(n)/P_{out(ave)} \qquad (7)$$

As indicated by the equation (1), in an ideal distortion-free situation, the power/average power ratio of the input modulate signal and the power/average power ratio of the output modulate signal are the same as each other.

In the modulated signal, r(n) varies depending on the sampling point n. Variations of r(n) are in accordance with the probability density function p(r). The ratio r represents a probability variable whose distribution is described by the probability density function p(r).

Using the equation (7), the variable $P_{in}(n)$ that appears in the gain $G(P_{in}(n))$ and the phase $\theta(P_{in}(n))$ in the equation (5) can be replaced with $P_{in(ave)} r(n)$.

The relationship between the power of the distortion-induced error vector of the modulated signal and the power dependency of the gain and the phase in the equation (4) is represented by the equation (8) shown below. The equation (8) can easily be obtained by substituting $S'_{out}(n)$ according to the equation (5) and $S_{out}(n)$ according to the equation (6) in $|S'_{out}(n) - S_{out}(n)|^2$ and modifying it according to the equation (3) and the equation (7).

$$|S'_{out}(n) - S_{out}(n)|^2 = P_{out(ave)} r(n) \cdot \left[ \left\{ \frac{G(r(n) P_{in(ave)})}{G(P_{in(ave)})} - 1 \right\}^2 + \right. \qquad (8)$$

$$\left. 4 \frac{G(r(n) P_{in(ave)})}{G(P_{in(ave)})} \sin^2 \left\{ \frac{\theta(r(n) P_{in(ave)}) - \theta(P_{in(ave)})}{2} \right\} \right]$$

It can be seen from the equation (8) that $|S'_{out}(n) - S_{out}(n)|^2$ represents a probability variable including the probability variable r. The expected value $E[|S'_{out}(n) - S_{out}(n)|^2]$ thereof is expressed by the equation (9) using the probability density function p(r) of the probability variable r. PAR (peak-to-average power ratio) in the integration interval represents the ratio of the peak power to the average power of the modulated signal, i.e., the maximum value of r.

$$E[|S'_{out}(n) - S_{out}(n)|^2] = P_{out(ave)} \int_0^{PAR} dr \cdot p(r) \cdot r \cdot \qquad (9)$$

$$\left[ \left\{ \frac{G(r P_{in(ave)})}{G(P_{in})} - 1 \right\}^2 + 4 \frac{G(r P_{in(ave)})}{G(P_{in(ave)})} \sin^2 \left\{ \frac{\theta(r P_{in(ave)}) - \theta(P_{in})}{2} \right\} \right]$$

By substituting the equation (9) in the equation (4), the relationship between the EVM value and the power dependency of the gain and the phase in the input modulated signal average power $P_{in(ave)}$ is given according to the equation (10).

$$EVM(P_{in(ave)}) = \qquad (10)$$

$$\sqrt{\int_0^{PAR} dr \cdot p(r) \cdot r \cdot \left[ \begin{array}{c} \left\{ \frac{G(r P_{in(ave)})}{G(P_{in(ave)})} - 1 \right\}^2 + \\ 4 \frac{G(r P_{in(ave)})}{G(P_{in(ave)})} \sin^2 \left\{ \frac{\theta(r P_{in(ave)}) - \theta(P_{in(ave)})}{2} \right\} \end{array} \right]}$$

According to the equation (10), the EVM value can directly be calculated from the data of the power dependency of the gain G and the phase θ. For evaluating the EVM value according to this EVM evaluating method, the data of the power dependency of the gain G and the phase θ is required.

In the flowchart shown in FIG. 8, the data of the power dependency of the gain G and the phase θ is evaluated by step A21 in which the evaluation signal is input to the system under test and step A22 in which an amplitude distortion and a phase distortion of the system under test are measured.

The evaluation signal should desirably include the carrier frequency of a desired modulated signal or should preferably be a signal having a frequency close to the carrier frequency.

For example, if the system under test does not exhibit a memory effect or has a weak memory effect, i.e., if the distortion characteristics thereof do not depend on the bandwidth of the modulated signal or weakly depend thereon, then since the EVM value can be evaluated accurately based on the power dependency of the gain G and the phase θ that are obtained when a sine wave at the carrier frequency of the desired modulated signal is input as an evaluation signal to the system under test, the power dependency of the gain G and the phase θ can be obtained according to a simple device and evaluating process. Therefore, in the event that the system under test does not exhibit a memory effect or has a weak memory effect, it is desirable to use a sine wave at the carrier frequency of the desired modulated signal as an evaluation signal.

If the channel bandwidth of the communication system is wide and frequency-dependent changes in the distortion characteristics are not negligible in the channel band, then the power dependency of the gain G and the phase θ may be evaluated at some frequencies in the channel band, and the EVM value at each of the frequencies may evaluated based on the evaluated power dependency. An average value of the EVM values at the respective frequencies may be used as a representative value of the EVM values in the channel.

According to another example, if the system under test exhibits a memory effect, i.e., if the distortion characteristics strongly depend on the bandwidth of the modulated signal, then since the power dependency of the gain G and the phase θ changes depending on the power sweep rate, the power sweep rate at the time the power dependency of the gain G and the phase θ is evaluated should desirably be closer to the rate at which the amplitude of the modulated signal changes. In this manner, the EVM value can be evaluated accurately from the power dependency of the gain G and the phase θ which is close to the value in actual operation.

The evaluation signal described above is preferable, but not limitative. The evaluation signal may be any signal insofar as it can measure the power dependency of the gain G and the phase θ at the carrier frequency of the desired modulated signal or at a frequency close to the carrier frequency.

The equation (10) includes the power dependency $G(P_{in})$ of the gain and the power dependency $\theta(P_{in})$ of the phase. Even if $G(P_{in})$ is replaced with $G(P_{in})/G'$ and $\theta(P_{in})$ with $\theta(P_{in})-\theta'$, the equation (10) remains unchanged where G' and θ' represent any desired constants. Therefore, it can be seen that $G(P_{in})/G'$ may be used in place of the gain $G(P_{in})$ and $\theta(P_{in})-\theta'$ may be used in place of the phase $\theta(P_{in})$.

For example, G' may be used as a limiting value at the input power 0 of $G(P_{in})$, i.e., as a linear gain G(0). In this case, $G(P_{in})/G(0)$ representative of a gain deviation from the linear gain, i.e., an amplitude distortion, may be used in place of the gain $G(P_{in})$ in the equation (10). Similarly, θ' may be used as a limiting value θ(0) at the input power 0 of $\theta(P_{in})$. In this case, $\theta(P_{in})-\theta(0)$ may be used in place of the gain $\theta(P_{in})$ in the equation (10).

In other words, $G(P_{in})/G(0)$ representative of a magnitude of amplitude distortion and $\theta(P_{in})-\theta(0)$ representative of a magnitude of phase distortion can be used.

In the equation (10), the unit of the power used in the definition of the gain $G(P_{in})$ has been described as an absolute value unit, e.g., [W]. However, if necessary, the unit of the power may be another unit, e.g., [dB], and the equation may be modified accordingly.

The unit of the phase $\theta(P_{in})$ has been described as [rad.]. However, if necessary the unit of the phase may be [degrees] or [seconds], and the equation may be modified accordingly.

In step S23 of the flowchart shown in FIG. 8, the probability density function p(r) of the power/average power ratio of the desired modulated signal is read. The probability density function p(r) has an inherent function form depending on the type of the modulated signal. For example, according to the quadrature frequency division multiplex modulating process (OFDM) with sufficiently many subcarriers, the probability density function p(r) is given by the equation (11), as shown in the literature IEEE Vehicular Technology Conference, proceedings, vol. 2, pp. 899-903, September, 2002.

$$p(r)=\exp(-r) \qquad (11)$$

Therefore, the function form of a probability density function p(r) that is predetermined according to a desired modulated signal may be recorded as data in a data processor or a memory, and the data of the probability density function p(r) of the power/average power ratio of the modulated signal may be read from the data processor or the memory in step A23. The data of the probability density function p(r) may be in the form of equational information representing a function form or data of a numerical value string obtained from an equation.

According to another process, a probability density function p(r) may be acquired in advance by measurement, the obtained numerical value string data may be recorded in a data processor or a memory, and the data may be read therefrom as the data of the probability density function p(r). This process is effectively applicable if the function form of the probability density function p(r) is theoretically not known. According to still another process, a probability density function p(r) may be measured in advance, an empirical equation representing the probability density function p(r) may be derived from the measured result, and the equation may be recorded in a data processor or a memory.

From the standpoint of reducing the amount of information to be stored, it is preferable to store the probability density function p(r) as equational information representing a function form, rather than numerical value string data, in a data processor or a memory.

If there are a plurality of desired modulating processes, then probability density functions p(r) corresponding to the respective modulating processes may be prepared for the evaluation of EVM values corresponding to the respective modulating processes.

In step A24 of the flowchart shown in FIG. 8, the integration included in the equation (10) is performed using the power dependency of the gain $G(P_{in})$ and the phase $\theta(P_{in})$ which have been obtained in steps A21, A22 and the probability density function p(r) that has been obtained in step A23.

In a range wherein r is sufficiently small or large, rp(r) included in the integrated function approaches 0, and the contribution of the range of r to the integral is negligible. Though the integration interval of the equation (10) ranges from 0 to PAR, the integration interval may be limited by suitable lower and upper limit values in actual calculations such that the EVM value will suffer no large error. With the integration interval being thus limited, the amount of data to be processed, and the processing time can be reduced without lowering the accuracy of the EVM value.

For performing the integration, data of the integrated function are extracted with a plurality of r values, and an integral is calculated using the trapezoid formula. In this case, data points may be selected as required. For example, if more importance is attached to accuracy, then more data points may be selected, and if more importance is attached to the reduction of an amount of data to be processed and a processing time, then less data points may be selected.

In the equation (10), the power/average power ratio of the modulated signal is employed as the integration variable. If necessary, however, the integration variable may be converted into another suitable variable. For example, the variable r may be converted into a modulated signal input power $P_{in}$ which is equal to $P_{in(ave)}$ for the integration.

In step A25 of the flowchart shown in FIG. 8, the square root of the integral obtained in step A24 is calculated according to the equation (10), thereby determining an EVM value.

The EVM value thus obtained is an absolute value. However, the EVM value may be expressed in another unit. For example, if the EVM value is to be expressed in percentage, then the value calculated according to the equation (10) may be multiplied by 100.

In step A26 of the flowchart shown in FIG. 8, it is determined whether the evaluation of a distortion is to be ended or not.

If the evaluation of a distortion is not to be ended, then the evaluation of a distortion may be repeated under the same evaluating conditions as before, or a distortion may be evaluated by changing an evaluating condition such as the average power, the carrier frequency, or the power sweep rate for evaluating the power dependency of the gain and the phase.

An actual EVM value may be affected by a residual EVM value of a circuit or a measuring system near the system under test, as well as the amplitude distortion and the phase distortion of the system under test. In step A27 of the flowchart shown in FIG. 8, it is determined whether such a residual EVM value is to be evaluated or not.

If it is judged in step A27 that a residual EVM value is to be evaluated, then the residual EVM value is evaluated in step A28. If it is judged in step A27 that a residual EVM value is not to be evaluated, then control jumps to step A30.

After the residual EVM value is evaluated in step A28, an EVM value which is a combination of the residual EVM value and the EVM value due to the distortion of the system under test is determined. A process of determining such an EVM value will be described below.

A total error vector $EVM_{total}$ of the demodulated signal, which takes into account both an error vector $e_{DUT}$ generated by the distortion of the system under test and an error vector $e_{res}$ generated by a circuit or a measuring system near the system under test, is expressed by the equation (12).

$$EVM_{total} = \sqrt{\frac{1}{P_0 N} \sum_{k=1}^{N} |e_{DUT}(k) + e_{res}(k)|^2} \quad (12)$$

$$= \sqrt{\frac{1}{P_0 N} \left\{ \begin{array}{l} \sum_{k=1}^{N} |e_{DUT}(k)|^2 + \\ \sum_{k=1}^{N} |e_{res}(k)|^2 + \\ 2 \sum_{k=1}^{N} e_{DUT}(k) \cdot e_{res}(k) \end{array} \right\}}$$

An EVM value ($EVM_{DUT}$) which takes into account only an error vector $e_{DUT}$ generated by the distortion of the system under test is expressed by the equation (13), and an EVM value ($EVM_{res}$) which takes into account only an error vector $e_{res}$ generated by a circuit or a measuring system near the system under test is expressed by the equation (14).

$$EVM_{DUT} = \sqrt{\frac{1}{P_0 N} \sum_{k=1}^{N} |e_{DUT}(k)|^2} \quad (13)$$

$$EVM_{res} = \sqrt{\frac{1}{P_0 N} \sum_{k=1}^{N} |e_{res}(k)|^2} \quad (14)$$

If the error vector $e_{DUT}$ generated by the distortion of the system under test and the error vector $e_{res}$ generated by a circuit or a measuring system near the system under test are not correlated to each other, then $EVM_{total}$, $EVM_{DUT}$, and $EVM_{res}$ are related to each other according to the equation (15).

$$EVM_{total}(P_{in(ave)}) = \sqrt{\{EVM_{DUT}(P_{in(ave)})\}^2 + \{EVM_{res}(P_{in(ave)})\}^2} \quad (15)$$

[∵ The equation $$\sum_{k=1}^{N} e_{DUT}(k) \cdot e_{res}(k) = 0$$

which indicates non-correlation, the equation (19), and the equation (20) are substituted in the equation (18), which is then rearranged.]

If $e_{DUT}$ and $e_{res}$ are correlated to each other, then the inequality (16) is generally satisfied. $EVM_{total}$ takes a maximum value ($EVM_{DUT}+EVM_{res}$) when $e_{DUT}$ and $e_{res}$ are parallel to each other and in the same direction at a desired sampling point. $EVM_{total}$ takes a minimum value ($|EVM_{DUT}-EVM_{res}|$) when $e_{DUT}$ and $e_{res}$ are parallel to each other and in opposite directions at a desired sampling point.

$$|EVM_{DUT}(P_{in(ave)}) - EVM_{res}(P_{in(ave)})| \leq EVM_{total}(P_{in(ave)}) \leq EVM_{DUT}(P_{in(ave)}) + EVM_{res}(P_{in(ave)}) \quad (16)$$

Consequently, if the characteristics ($EVM_{res}$) of the residual EVM value are known, then it is possible to obtain an EVM value ($EVM_{total}$) involving both the distortion of the system under test and the residual EVM value caused by other than the system under test, using the equation (15) in combination with the EVM value ($EVM_{DUT}$) of the system under test which has been obtained according to the equation (10), for example. The EVM value obtained using the equation (15) is of good accuracy if the distortion of the system under test and the error (residual EVM value) caused by other than the system under test are not correlated to each other or nearly not correlated to each other.

Alternatively, lower and upper limit values for the EVM value ($EVM_{total}$) involving both the distortion of the system under test and the residual EVM value caused by other than the system under test, may be estimated using the equation (16), rather than the equation (15), and a value between the lower and upper limit values may be used as an EVM value.

According to the flowchart shown in FIG. 8, after an EVM value due to the distortion of the system under test is evaluated, a residual EVM value is evaluated. However, after a residual EVM value is evaluated, an EVM value due to the distortion of the system under test may be evaluated. There is no limitation on the order of evaluations.

In step A30 of the flowchart shown in FIG. 8, it is determined whether the evaluation sequence is to be ended or not. If the evaluation sequence is not to be ended, then it is performed again from step A21.

2nd Embodiment

In the first embodiment, the power dependency of a gain $G(P_{in})$ and a phase $\theta(P_{in})$ are evaluated, and an EVM value taking into account both the amplitude distortion and the phase distortion is determined according to the equation (10), for example. According to the present invention, however, the power dependency of only a gain $G(P_{in})$ may be evaluated, and an EVM value ($EVM_{AM/AM}$) taking into account only the amplitude distortion may be calculated. In this case, the EVM value is expressed by the equation (17) which excludes the effect of the phase distortion by setting $\theta(rP_{in(ave)})-\theta(P_{in(ave)})$ to 0 in the equation (10).

$$EVM_{AM/AM}(P_{in(ave)}) = \sqrt{\int_0^{PAR} dr \cdot p(r) \cdot r \cdot \left\{\frac{G(rP_{in(ave)})}{G(P_{in(ave)})} - 1\right\}^2} \quad (17)$$

The $EVM_{AM/AM}$ value given by the equation (17) may be expressed by the equation (18) using a gain $G_{(dB)}(P_{in})$ which is equal to the gain $G(P_{in})$ expressed in [dB].

$$EVM_{AM/AM}(P_{in(ave)}) = \quad (18)$$
$$\sqrt{\int_0^{PAR} dr \cdot p(r) \cdot r \cdot \left\{10^{\{G_{(dB)}(rP_{in(ave)})-G_{(dB)}(P_{in(ave)})\}/20} - 1\right\}^2}$$

If the amplitude distortion is sufficiently small ($\{G_{(dB)}(rP_{in(ave)})-G_{(dB)}(P_{in(ave)})\} \ll 20$ dB), then the equation (18) can be approximated and simplified according to the equation (19).

$$EVM_{AM/AM}(P_{in(ave)}) \approx \quad (19)$$
$$\frac{\ln 10}{20}\sqrt{\int_0^{PAR} dr \cdot p(r) \cdot r \cdot \{G_{(dB)}(rP_{in(ave)}) - G_{(dB)}(P_{in(ave)})\}^2}$$

[∵ Taylor expansion approximation according to $10^x \approx 1 \times x \ln 10$, $x = \{G_{(dB)}(rP_{in(ave)})-G_{(dB)}(P_{in(ave)})\}/20$]

As when only the amplitude distortion is taken into account, only the power dependency of the phase $\theta(P_{in})$ may be evaluated, and an EVM value ($EVM_{AM/PM}$) taking into account only the phase distortion may be calculated. In this case, the EVM value is expressed by the equation (20) which excludes the effect of the amplitude distortion by setting $G(rP_{in(ave)})/G(P_{in(ave)})$ to 1 in the equation (10).

$$EVM_{AM/PM}(P_{in(ave)}) = \quad (20)$$
$$\sqrt{\int_0^{PAR} dr \cdot p(r) \cdot r \cdot 4\sin^2\left\{\frac{\theta(rP_{in(ave)}) - \theta(P_{in(ave)})}{2}\right\}}$$

If the phase distortion is sufficiently small ($\theta(rP_{in(ave)})-\theta(P_{in(ave)}) \ll 2$ rad=115°), then the equation (20) can be approximated and simplified according to the equation (21), using the phase $\theta_{(deg)}(P_{in})$ expressed in [degrees].

$$EVM_{AM/PM}(P_{in(ave)}) \approx \quad (21)$$
$$\frac{\pi}{180}\sqrt{\int_0^{PAR} dr \cdot p(r) \cdot r \cdot \{\theta_{(deg)}(rP_{in(ave)}) - \theta_{(deg)}(P_{in(ave)})\}^2}$$

[∵ Taylor expansion approximation according to $\sin x \approx x$, $x = \{\theta(rP_{in(ave)})-\theta(P_{in(ave)})\}/2$]

If the amplitude distortion is sufficiently small ($G(rP_{in(ave)})/G(P_{in(ave)}) \sim 1$), then the EVM value obtained by the equation (10) taking into account both the amplitude distortion and the phase distortion, the $EVM_{AM/AM}$ value obtained by the equation (17) taking into account only the amplitude distortion, and the $EVM_{AM/PM}$ value obtained by the equation (20) taking into account only the phase distortion are related to each other approximately according to the equation (22).

$$EVM(P_{in(ave)}) \approx \sqrt{\{EVM_{AM/AM}(P_{in(ave)})\}^2 + \{EVM_{AM/PM}(P_{in(ave)})\}^2} \quad (22)$$

Therefore, an $EVM_{AM/AM}$ value taking into account only the amplitude distortion may be determined by the equation (17) or (18) or (19), an $EVM_{AM/PM}$ value taking into account only the phase distortion may be determined by the equation (20) or (21), and an EVM value taking into account both the amplitude distortion and the phase distortion may be calculated by the equation (22) using the $EVM_{AM/AM}$ value and the $EVM_{AM/PM}$ value that have been determined.

Figure 10:
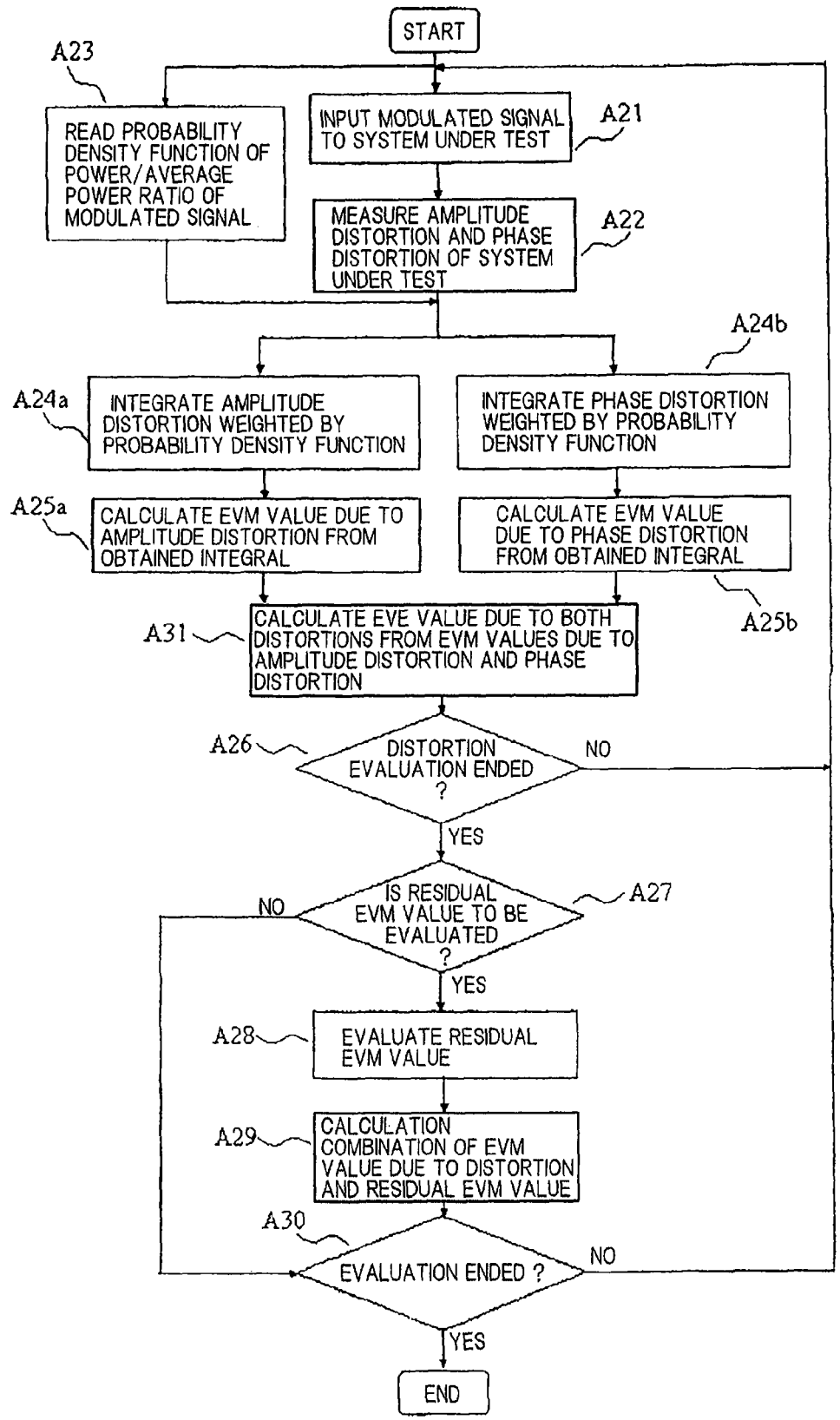
FIG. 10 is a flowchart of a sequence according to an EVM evaluating method according to a second embodiment.

FIG. 10 is a flowchart of a sequence according to an EVM evaluating method according to a second embodiment. The EVM evaluating method shown in FIG. 10 evaluates a total EVM value from an EVM value taking into account only an amplitude distortion and an EVM value taking into account only a phase distortion. The flowchart shown in FIG. 10 represents a sequence of the EVM evaluating method.

According to the second embodiment, step A24 of the first embodiment is replaced with step A24a for integrating an amplitude distortion that has been weighted by a probability density function, and step A24b for similarly integrating a phase distortion. According to the second embodiment, step A25 of the first embodiment is replaced with step A25a for calculating an EVM value due to the amplitude distortion from the integral obtained by step A24a, and step A25b for calculating an EVM value due to the phase distortion from the integral obtained by step A24b.

The second embodiment also differs from the first embodiment in that after steps A25a, A25b, an EVM value due to the amplitude distortion and the phase distortion is calculated from the EVM value due to the amplitude distortion and the EVM value due to the phase distortion in step A31.

According to the flowchart shown in FIG. 10, an EVM value ($EVM_{AM/AM}$) due to the amplitude distortion may be calculated from the data of the power dependency of the gain $G(P_{in})$ according to the equations (17), (18), (19), for example, in steps A24a, A25a, and an EVM value ($EVM_{AM/PM}$) due to the phase distortion may be calculated from the data of the power dependency of the phase $\theta(P_{in})$ according to the equations (20), (21), for example, in steps A24b, A25b.

In step S31, an EVM value including both the amplitude distortion and the phase distortion may be calculated from the EVM value ($EVM_{AM/AM}$) due to the amplitude distortion and the EVM value ($EVM_{AM/PM}$) due to the phase distortion according to the equation (22), for example. Alternatively, the EVM value ($EVM_{AM/AM}$) due to the amplitude distortion and the EVM value ($EVM_{AM/PM}$) due to the phase distortion may be evaluated, and an EVM value including both the amplitude distortion and the phase distortion may separately be calculated according to the equation (10).

3rd Embodiment

According to another EVM evaluating method, only an EVM value ($EVM_{AM/AM}$) due to an amplitude distortion may be evaluated A third embodiment is addressed to such an EVM evaluating method.

Figure 11:
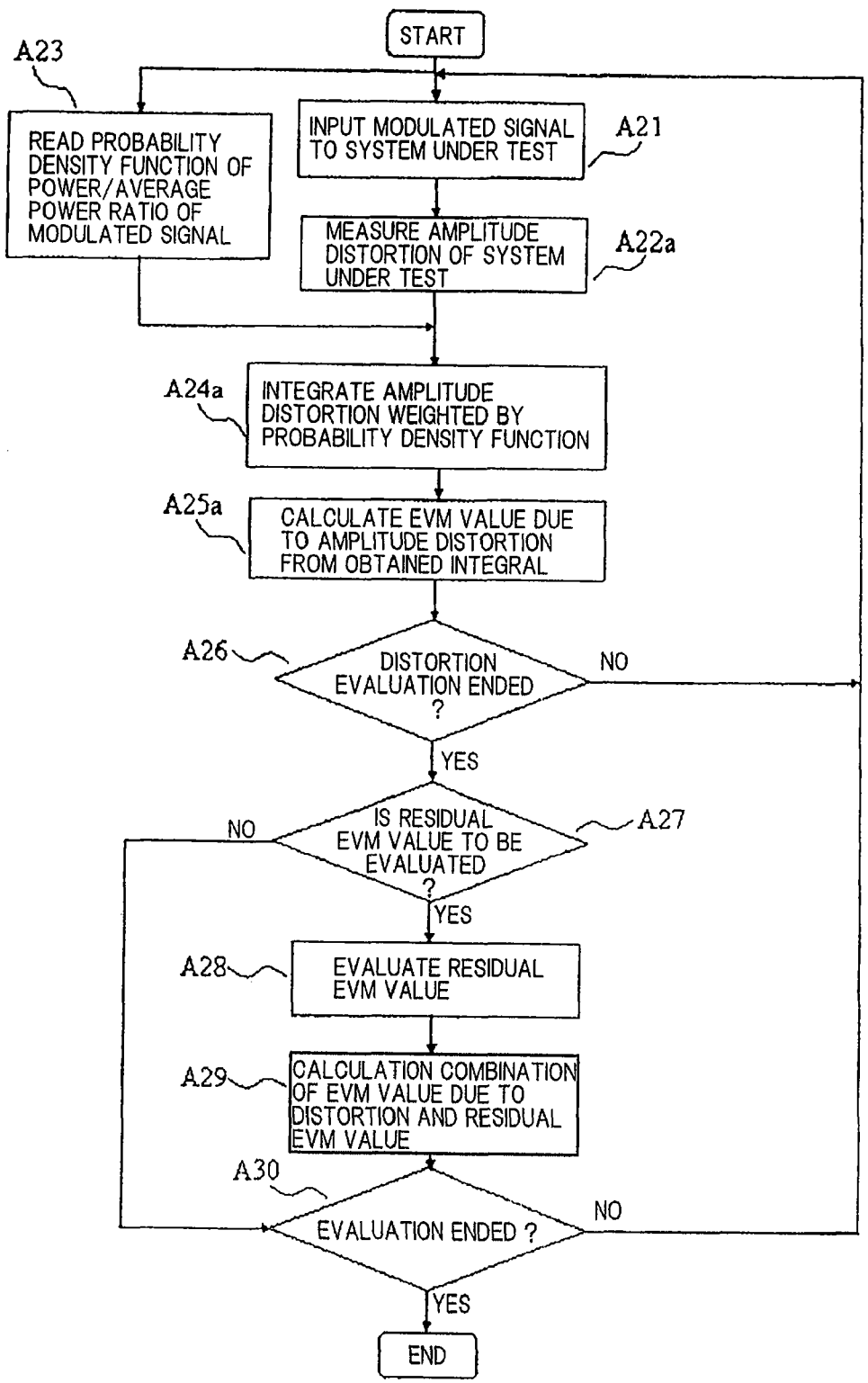
FIG. 11 is a flowchart of a sequence according to an EVM evaluating method according to a third embodiment.

FIG. 11 is a flowchart of a sequence according to an EVM evaluating method according to a third embodiment. According to the third embodiment, step A22 according to the second embodiment shown in FIG. 10 is replaced with step A22a for measuring an amplitude distortion of a system under test. Steps A24b, A25b for calculating an EVM value due to a phase distortion, and step A31 for calculating an EVM value due to both an amplitude distortion and a phase distortion from EVM values due to the amplitude distortion and the phase distortion are dispensed with.

4th Embodiment

According to another EVM evaluating method, only an EVM value ($EVM_{AM/PM}$) due to a phase distortion may be evaluated. A fourth embodiment is addressed to such an EVM evaluating method.

Figure 12:
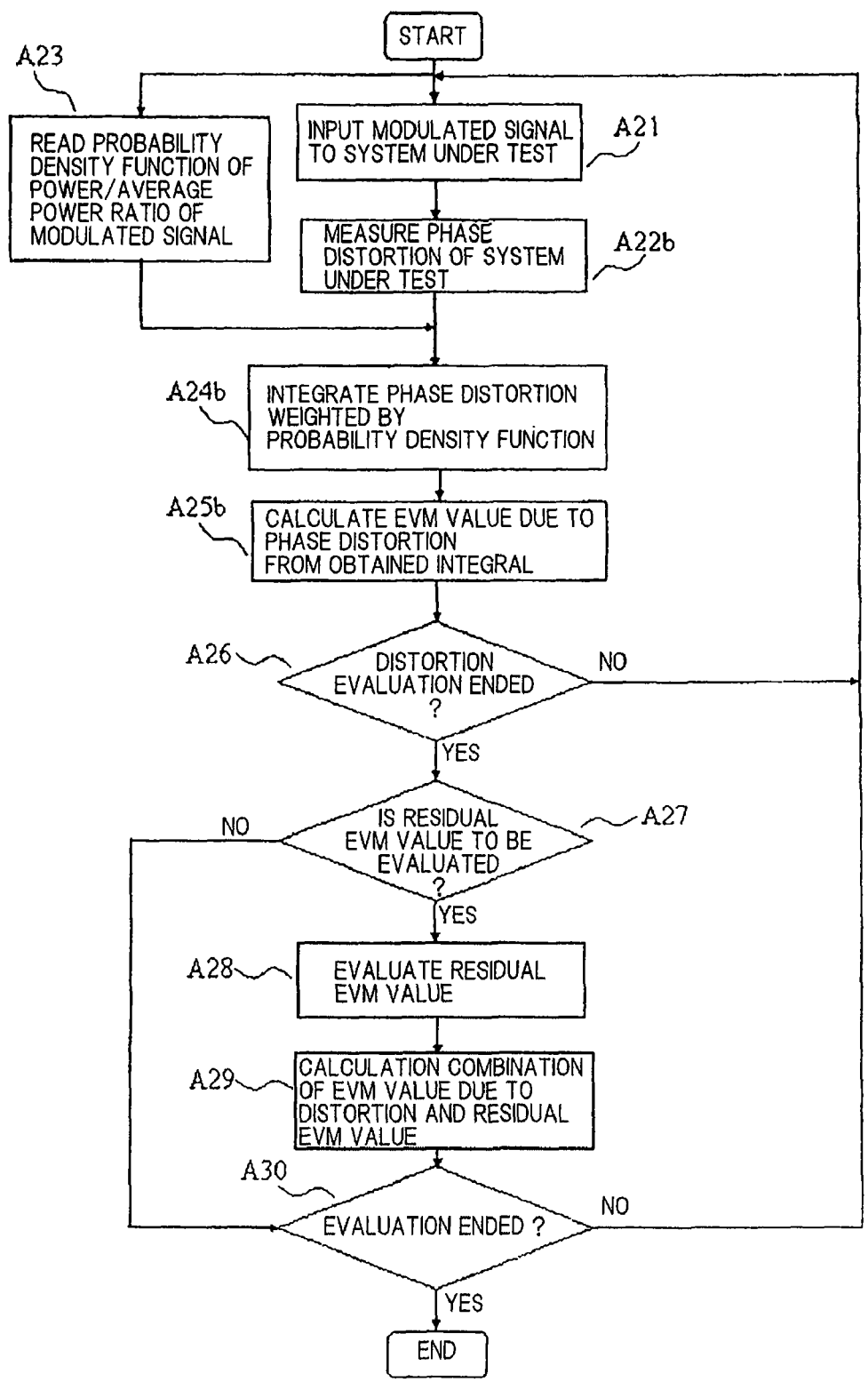
FIG. 12 is a flowchart of a sequence according to an EVM evaluating method according to a fourth embodiment.

FIG. 12 is a flowchart of a sequence according to an EVM evaluating method according to a fourth embodiment. According to the fourth embodiment, step A22 according to the second embodiment shown in FIG. 10 is replaced with step A22b for measuring a phase distortion of a system under test. Steps A24a, A25a for calculating an EVM value due to an amplitude distortion, and step A31 for calculating an EVM value due to both an amplitude distortion and a phase distortion from EVM values due to the amplitude distortion and the phase distortion are dispensed with.

With the EVM evaluating methods according to the first through fourth embodiments described above, an EVM value can be calculated from the data of the power dependency of at least one of the gain $G(P_{in})$ and the phase $\theta(P_{in})$ and the probability density function p(r) corresponding to the modulating process. Therefore, it is not necessary to make many samplings and perform averaging calculations which would lead to an increase in the circuit scale and power consumption and also to an increase in the amount of calculations.

Heretofore, an EVM value is evaluated by averaging the power levels of error vectors at many sampling points according to the equation (1). With the EVM evaluating methods according to the first through fourth embodiments, an EVM value can be calculated by calculating the integration according to the equation (10), for example, rather than calculating an average at the sampling points. Therefore, the amount of calculations and the amount of data are reduced.

With the EVM evaluating methods according to the first through fourth embodiments, since an EVM value can be evaluated using a sine wave, for example, rather than a modulated signal, there is no need for a highly costly demodulator corresponding to the modulated signal to be provided for EVM evaluation.

These EVM evaluating methods are applicable to devices in a wide variety of fields, e.g., a circuit simulator mounted on a data processor or a memory, a device for experimentally evaluating an EVM value, and a communication circuit which uses an EVM value as a parameter.

5th Embodiment

Figure 13:
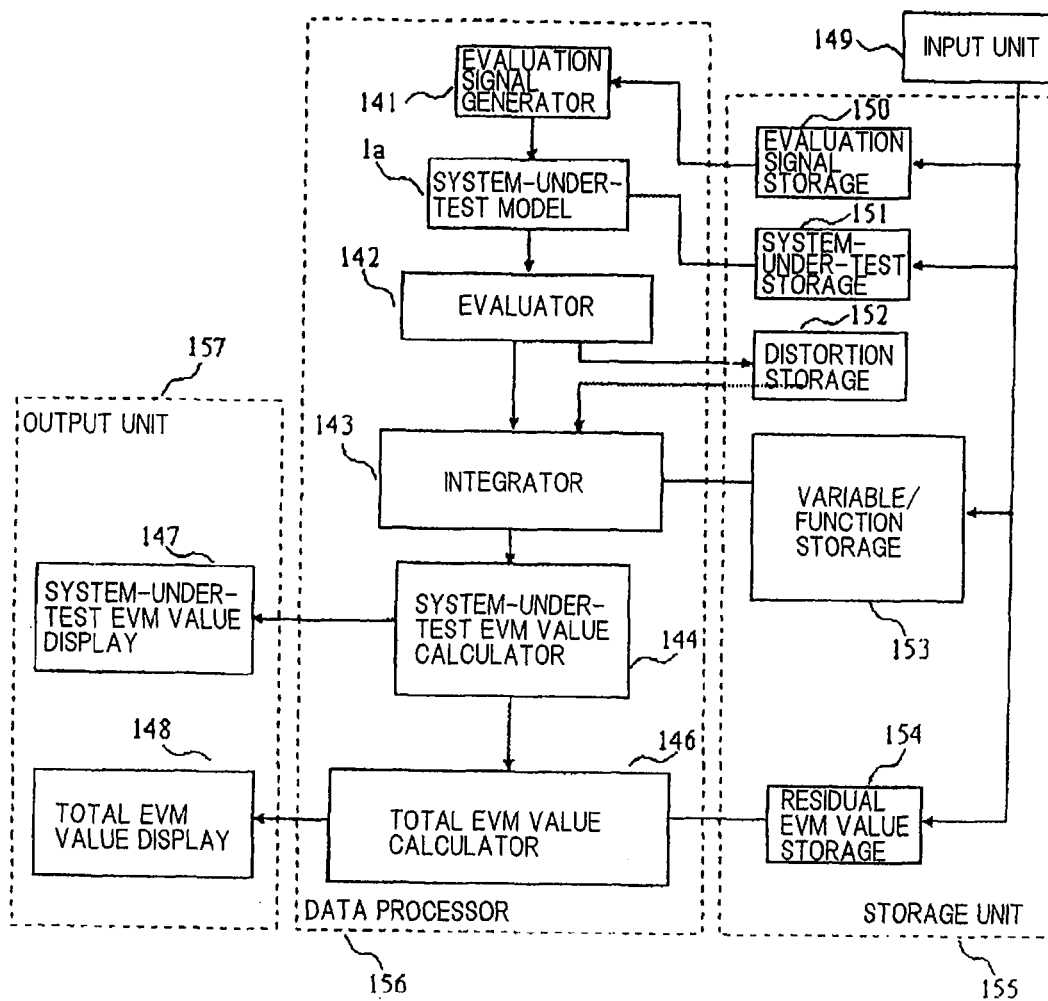
FIG. 13 is a block diagram showing an arrangement of a circuit simulator according to a fifth embodiment.

According to a fifth embodiment of the present invention, a circuit simulator employs an EVM evaluating method referred to above. FIG. 13 is a block diagram showing an arrangement of a circuit simulator according to a fifth embodiment. As shown in FIG. 13, the circuit simulator has input device 149, storage unit 155, data processor 156, and output device 157.

The circuit simulator according to the fifth embodiment employs the EVM evaluating method according to the first embodiment.

Input unit 149 is a unit, such as a keyboard, for example, for entering information such as various data when it is operated.

Storage unit 155 comprises evaluation signal storage 150, system-under-test storage 151, distortion storage 152, variable/function storage 153, and residual EVM value storage 154.

Evaluation signal storage 150 stores the information of an evaluation signal entered from input unit 149. System-under-test storage 151 stores the information of a system under test entered from input unit 149. Distortion storage 152 stores an amplitude distortion and a phase distortion which are obtained by data processor 156. Variable/function storage 153 stores a modulated signal power/average power ratio and a probability density function which are entered from input unit 149. Residual EVM value storage 154 stores a residual EVM value entered from input unit 149.

Data processor 156 comprises a computer for performing a predetermined simulating process by executing a program. By executing the program, data processor 156 realizes an arrangement having evaluation signal generator 141, system-under-test model 1a, evaluator 142, integrator 142, system-under-test EVM value calculator 144, and total EVM value calculator 146.

Output unit 157 is a unit for outputting information from data processor 156, e.g., a display or a printer. Output device 157 has system-under-test EVM value display 147 and total EVM value display 148.

In the circuit simulator thus constructed, the information of an evaluation signal is entered from input unit 149 and stored in evaluation signal storage 150. The information of an evaluation signal represents the type of the evaluation signal, e.g., information specifying whether the evaluation signal is a sine wave or a modulated wave, the frequency of a carrier, the power sweep rate, and a routine program for generating the evaluation signal.

The information of a system under test is entered from input unit 149 and stored in system-under-test storage 151. The information of a system under test represents a model parameter for reproducing the characteristics of the system under test, and a routine program.

The information of a probability density function p(r) of the power/average power ratio r of a desired modulated signal is entered from input unit 149 and stored in variable/function storage 153. The information of the probability density function p(r) has been described in detail in the first embodiment.

Evaluation signal generator 141 generates a numerical evaluation signal based on the information stored in evaluation signal storage 150. The generated evaluation signal is input to system-under-test model 1a.

Based on the information of the system under test stored in system-under-test storage 151, system under-test-model 1a performs a predetermined numerical calculation on the evaluation signal output from evaluation signal generator 141.

Evaluator 142 measures the power dependency of an amplitude distortion and a phase distortion of system-under-test model 1a from a signal output from system-under-test model 1a. As described in detail in the first embodiment, the evaluation signal may be any signal inasmuch as it is capable of measuring the power dependency of the gain G and the phase θ at the carrier frequency of a desired modulated signal or a frequency close to the carrier frequency.

Data of the power dependency, obtained by evaluator 142, of the amplitude distortion and the phase distortion of system-under-test model 1a are stored in distortion storage 152.

Integrator 143 integrates a distortion weighted by a probability density function, using the data, stored in distortion storage 152, of the power dependency of the amplitude distortion and the phase distortion of system-under-test model 1a and the information of the probability density function p(r) stored in variable/function storage 153. The integration is, for example, the integration included in the equation (10).

System-under-test EVM value calculator 144 calculates the square root of the integral obtained by integrator 143 according to the equation (10), for example, thereby calculating an EVM value due to the distortion of the system-under test model. The EVM value calculated by system-under-test EVM value calculator 144 is displayed by system-under-test EVM value display 147.

If it is necessary to take into account a residual EVM value of a circuit or a measuring system near the system under test, then the data of a previously obtained residual EVM value is entered from input unit 149 and stored in residual EVM value storage 154.

Total EVM value calculator 146 calculates a total EVM value involving both a distortion-induced EVM and a residual EVM, using the EVM value obtained by system-under-test EVM value calculator 144 and the EVM value stored in residual EVM value storage 154. The total EVM value is calculated by the equation (15) or (16). The EVM value obtained by total EVM value calculator 146 is displayed by total EVM value display 148.

If only an EVM value due to an amplitude distortion is to be evaluated, then evaluator 142 shown in FIG. 13 may evaluate only an amplitude distortion, and integrator 143 and system-under-test EVM value calculator 144 may calculate an EVM value due to the amplitude distortion according to the equation (17), (18), or (19), for example.

If only an EVM value due to a phase distortion is to be evaluated, then evaluator 142 shown in FIG. 13 may evaluate only a phase distortion, and integrator 143 and system-under-test EVM value calculator 144 may calculate an EVM value due to the phase distortion according to the equation (20) or (21), for example.

6th Embodiment

Figure 14:
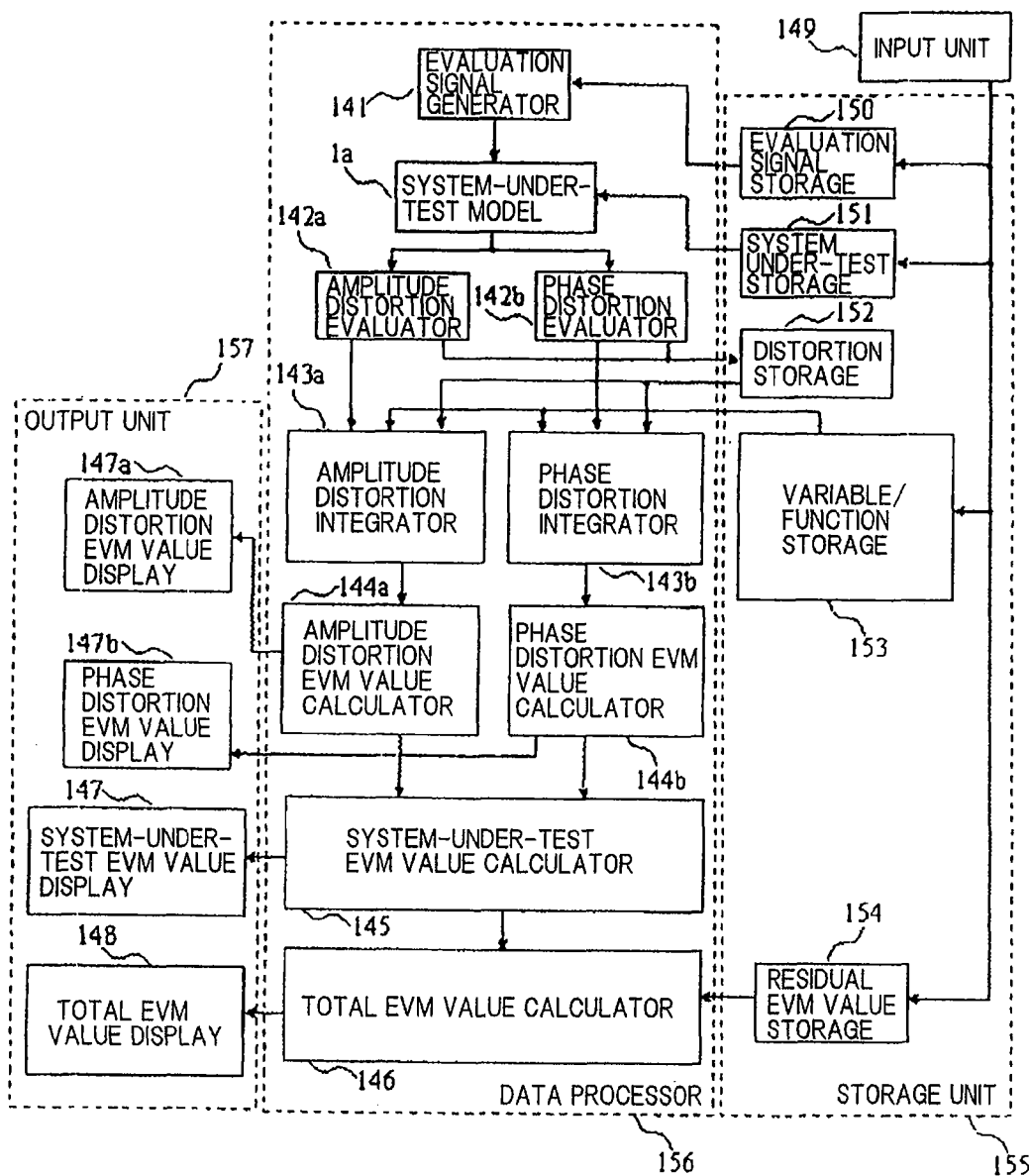
FIG. 14 is a block diagram showing an arrangement of a circuit simulator according to a sixth embodiment.

According to a sixth embodiment of the present invention, a circuit simulator employs the EVM evaluating method according to the second embodiment. FIG. 14 is a block diagram showing an arrangement of a circuit simulator according to a sixth embodiment. As shown in FIG. 14, the circuit simulator has input device 149, storage unit 155, data processor 156, and output device 157.

Input unit 149 and storage unit 155 are the same as whose shown in FIG. 13.

Data processor 156 comprises a computer for performing a predetermined simulating process by executing a program. By executing the program, data processor 156 realizes an arrangement having evaluation signal generator 141, system-under-test model 1a, amplitude distortion evaluator 142a, phase distortion evaluator 142b, amplitude distortion integrator 143a, phase distortion integrator 143b, amplitude distortion EVM value calculator 144a, phase distortion EVM value calculator 144b, system under test EVM value calculator 145, and total EVM value calculator 146.

According to the present embodiment, in other words, evaluator 142 according to the fifth embodiment shown in FIG. 13 is replaced with amplitude distortion evaluator 142a and phase distortion evaluator 142b, and integrator 143 with amplitude distortion integrator 143a and phase distortion integrator 143b. System-under-test EVM value calculator 144 according to the fifth embodiment is replaced with amplitude distortion EVM value calculator 144a and phase distortion EVM value calculator 144b, with system under test EVM value calculator 145 being newly added.

Output unit 157 is a unit for outputting information from data processor 156, e.g., a display or a printer. Output device 157 has system-under-test EVM value display 147 and total EVM value display 148, and also includes amplitude distortion EVM value display 147a and phase distortion EVM value display 147b.

Amplitude distortion evaluator 142a determines the power dependency of an amplitude distortion and sends the determined power dependency to amplitude distortion integrator 143a. Amplitude distortion integrator 143a performs the integration included in the equation (17), (18), or (19), using the power dependency of the amplitude distortion obtained by amplitude distortion evaluator 142a and the probability density function p(r) read from the variable/function storage 153.

Phase distortion evaluator 142b determines the power dependency of a phase distortion and sends the determined power dependency to phase distortion integrator 143b. Phase distortion integrator 143b performs the integration included in the equation (20) or (21), using the power dependency of the phase distortion obtained by phase distortion evaluator 142b and the probability density function p(r) read from the variable/function storage 153.

Amplitude distortion EVM value calculator 144a calculates the square root of the integral obtained by amplitude distortion integrator 143a according to the equation (17), (18), or (19), for example, thereby calculating an EVM value due to the amplitude distortion. Phase distortion EVM value calculator 144b calculates the square root of the integral obtained by phase distortion integrator 143b according to the equation (20) or (21), for example, thereby calculating an EVM value due to the phase distortion. The EVM value due to the amplitude distortion which is calculated by amplitude distortion EVM value calculator 144a is displayed by amplitude distortion EVM value display 147a. The EVM value due to the phase distortion which is calculated by phase distortion EVM value calculator 144b is displayed by phase distortion EVM value display 147b.

System under test EVM value calculator 145 calculates an EVM value of the system under test which involves both the amplitude distortion and the phase distortion according to the equation (22), for example, using the EVM value due to the amplitude distortion which is calculated by amplitude distortion EVM value calculator 144a and the EVM value due to the phase distortion which is calculated by phase distortion EVM value calculator 144b.

If the effect of the residual EVM value does not need to be taken into account in the fifth and sixth embodiments, then residual EVM value storage 154, total EVM value calculator 146, and total EVM value display 148 may be dispensed with.

Figure 1:
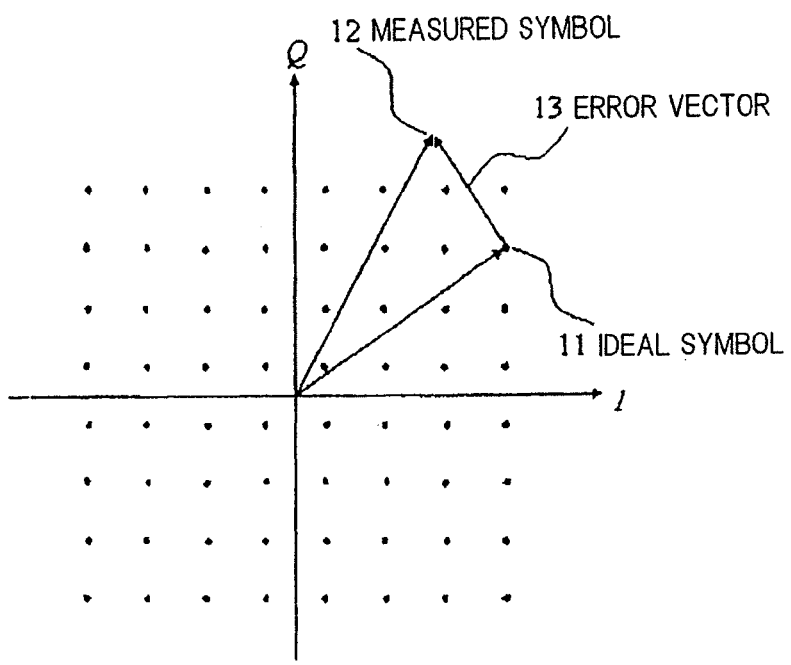
FIG. 1 is a is a diagram showing an example of a general demodulated signal.
Figure 2:
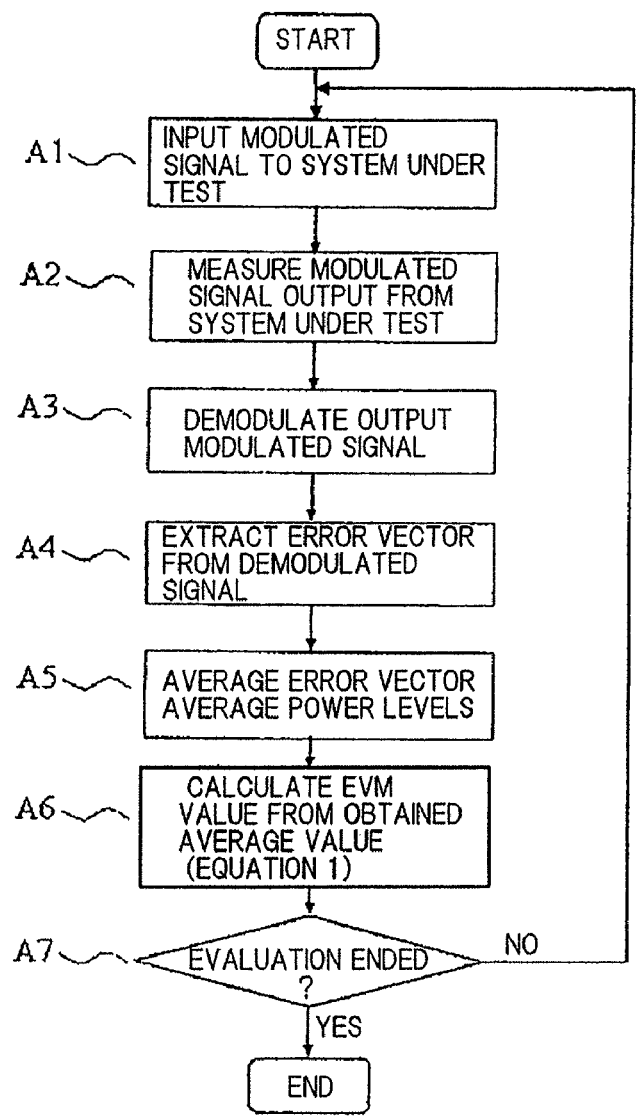
FIG. 2 is a flowchart of a sequence according to a conventional general EVM evaluating method.
Figure 3:
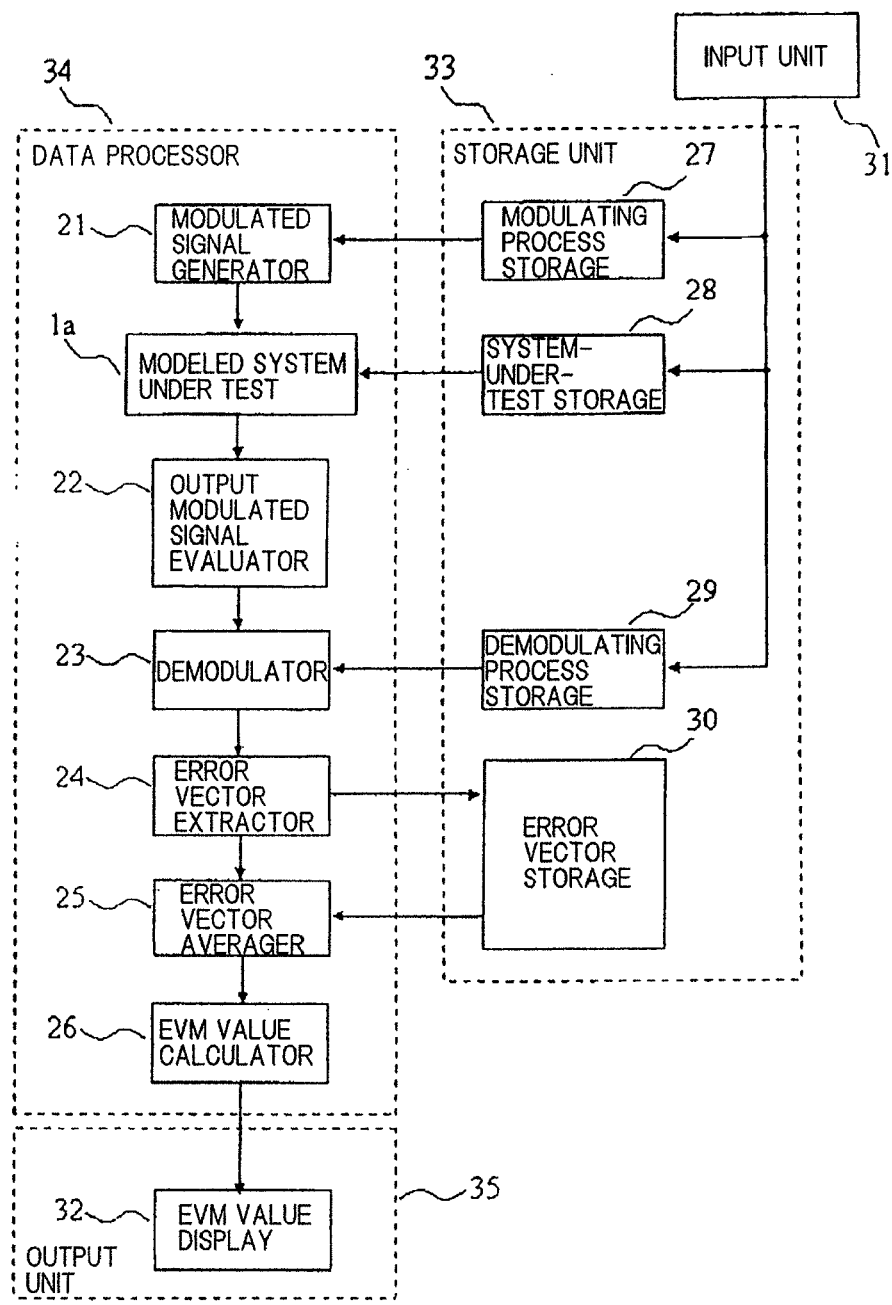
FIG. 3 is a block diagram showing an arrangement of a conventional circuit simulator with a function to calculate an EVM value.
Figure 15:
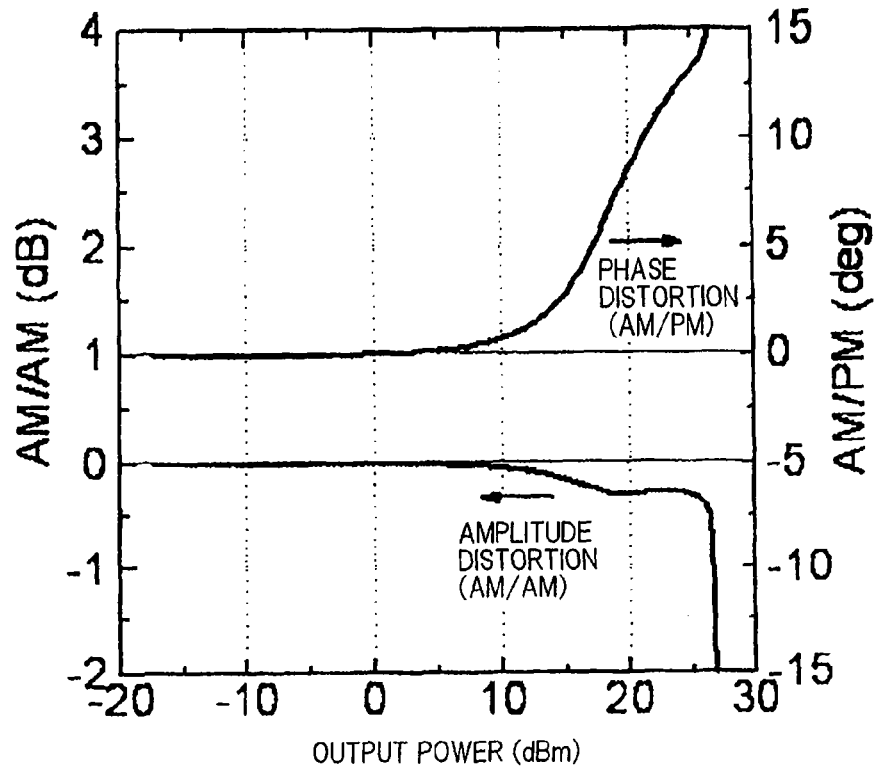
FIG. 15 is a graph showing the power dependency of an amplitude distortion and a phase distortion of an amplifier as an example of a system under test.
Figure 16:
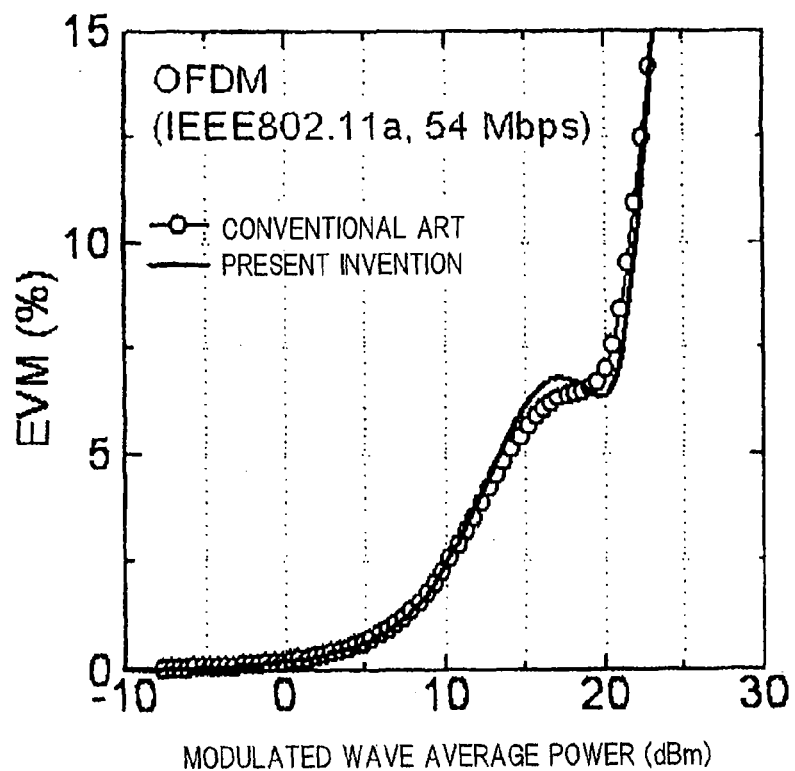
FIG. 16 is a graph showing for compassion EVM values calculated according to the conventional art and the sixth embodiment.

FIG. 15 is a graph showing the power dependency of an amplitude distortion and a phase distortion of an amplifier as an example of a system under test, and FIG. 16 is a graph showing for compassion EVM values calculated according to the conventional art and the sixth embodiment. FIG. 16 shows EVM values calculated by the conventional art shown in FIG. 3 and the sixth embodiment shown in FIG. 14, in the case where the system under test comprises an amplifier having the characteristics shown in FIG. 15 and an OFDM modulated signal according to the IEEE802.11a standards is input to the system under test.

It can be seen from FIG. 16 that the calculated results according to the sixth embodiment match the calculated results according to the conventional art very well. This indicates that the EVM value evaluating method according to the sixth embodiment which does not employ many sampling points and a demodulator corresponding to a desired modulating process is capable of evaluating an EVM value correctly with as much accuracy as with at least the conventional art shown in FIG. 3.

In calculating the EVM values shown in FIG. 16, an OFDM modulated signal is actually input to the system under test and an output signal therefrom is demodulated according to the conventional art. Therefore, the conventional art requires a simulator corresponding to the OFDM modulation and demodulation. Generally, however, a simulator with such a highly sophisticated calculating function is highly expensive and is hardly in wide use.

According to the sixth embodiment, an EVM value is calculated from the power dependency of an amplitude distortion and a phase distortion that are obtained when a sine wave is input to the system under test. Specifically, according to the sixth embodiment, an EVM value can be evaluated without the need for the OFDM modulation and demodulation. According to the sixth embodiment, a simulator having a function to calculate at least a sine-wave response may be enough, and such calculations can be performed by a harmonic balance simulator which is comparative inexpensive and in wide use.

Though a sine wave is used as an evaluation signal in the sixth embodiment, a signal other than a sine wave may also be used.

Heretofore, a high-functionality simulator is required because of the need for modulating and demodulating processes. According to the present invention, however, since no modulating and demodulating processes are needed, an EVM value can be calculated by a less expensive simulator in wide use.

For calculating the EVM values shown in FIG. 16, it has been customary according to the conventional art to calculate EVM values using an OFDM modulated signal having 52 subcarriers, a packet length of 100, and 20 frames. In order to calculate an EVM value at average power at one point, it is necessary to sample error vectors at 52×100×20=104000 points and average the power levels of the error vectors.

According to the sixth embodiment, in order to calculate an EVM value at the average power at one point, data are extracted at intervals of 0.5 dB in the range of the power/average power ratio of the modulated signal from −13.5 dB to 7 dB, and an integral is calculated using the trapezoid formula. Therefore, data of an amplitude distortion and a phase distortion of the power at (7−(−13.5))/0.5+1=42 points may be sufficient. Consequently, an EVM value can be calculated with as much accuracy as with the conventional art based on much fewer data points than with the conventional art.

In other words, the number of data required to evaluate an EVM value is greatly reduced from the number of data required for the conventional art. The reduced number of required data contributes to a reduction in the calculation time. For example, the calculation time required to obtain the EVM values shown in FIG. 16 was 228 seconds according to the conventional art and 26 seconds according to the sixth embodiment.

The integration interval is selected such that the r value is in the range from −13.5 dB to 7 dB because the range of the r value is determined to make the value of the probability density function of the OFDM modulated signal according to the IEEE802.11a standards equal to 1% or greater. However, the integration interval may be set to an interval different from the above interval, and the present invention is not limited to any particular interval. The number of data points used for the integration is not limited to the above value.

The modulating process according to the wireless LAN IEEE802.11a has been described by way of example above. The present invention is not limited to this modulating process. The process of evaluating an EVM value according to the present invention is applicable to other modulating processes.

As described above, the circuit simulator according to the fifth and sixth embodiments does not require many sampling points and an averaging process therefor which have been required by the conventional art. Therefore, the calculation time for simulations is greatly shortened.

The circuit simulator according to the fifth and sixth embodiments does not require calculations for the modulating and demodulating processes which have been required by the conventional art, and hence may be realized as a less expensive and simpler circuit simulator.

7th Embodiment

Figure 17:
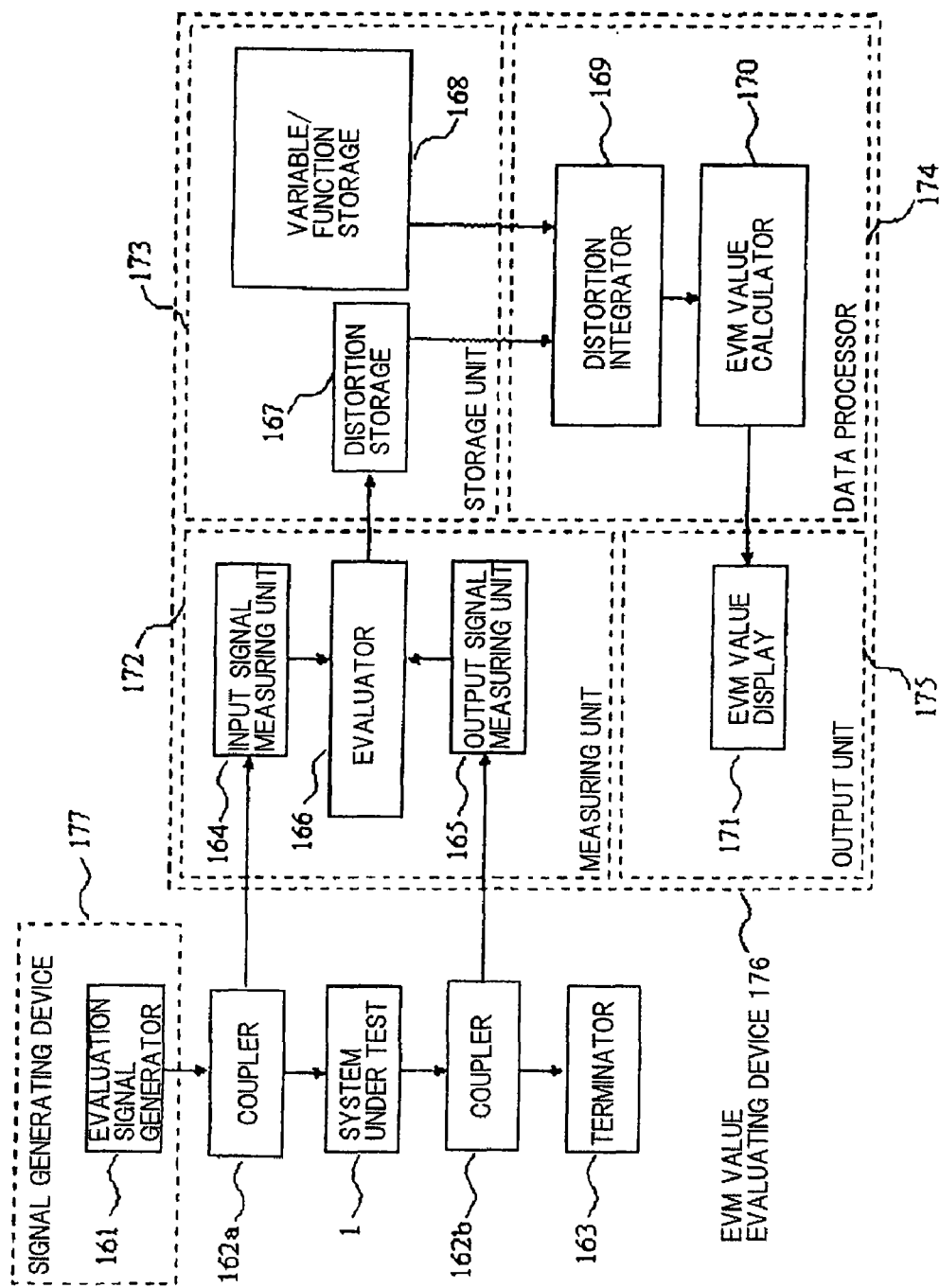
FIG. 17 is a block diagram showing an arrangement of a measuring device according to a seventh embodiment.

According to a seventh embodiment of the present invention, a measuring device employs an EVM evaluating method referred to above. FIG. 17 is a block diagram showing an arrangement of a measuring device according to a seventh embodiment. As shown in FIG. 17, the measuring device has signal generating device 177 and EVM value evaluating device 176.

Signal generating device 177 has evaluation signal generator 161. EVM value evaluating device 176 has measuring unit 172, storage unit 173, data processor 174, and output unit 175.

Measuring unit 172 has input signal measuring unit 164, output signal measuring unit 165, and evaluator 166. Storage unit 173 has distortion storage 167 and variable/function storage 168. Data processor 174 has integrator 169 and EVM value calculator 170. Output unit 175 has EVM value display 171.

An evaluation signal generated by evaluation signal generator 161 is applied by coupler 162a to system 1 under test and EVM value evaluating device 176. An output signal from system under test is applied by coupler 162b to terminator 163 and EVM value evaluating device 176.

With the arrangement shown in FIG. 17, evaluation signal generator 161 of signal generating device 177 generates a predetermined evaluation signal and inputs the evaluation signal to coupler 162a. The evaluation signal may be any signal insofar as it can measure the power dependency of the gain G and the phase θ at the carrier frequency of the desired modulated signal or at a frequency close to the carrier frequency.

The evaluation signal is input via the coupler 162 to system 1 under test and input signal measuring unit 164. Input signal measuring unit 164 measures the amplitude and the phase of the evaluation signal.

When the evaluation signal is input to system 1 under test, system 1 under test outputs a signal which is send via coupler 162b to output signal measuring unit 165. An output signal branched by coupler 162b is terminated by terminator 163. Coupler 162b may be connected to another measuring unit such as a spectral analyzer or the like instead of terminator 163.

When the output signal is given to output signal measuring unit 165, output signal measuring unit 165 measures the amplitude and the phase of the output signal.

The measured results from input signal measuring unit 164 and output signal measuring unit 165 are supplied to evaluator 166.

Evaluator 166 determines the power dependency of an amplitude distortion and a phase distortion of system 1 under test from the amplitude and the phase of the input evaluation signal which are obtained by input signal measuring unit 164 and the amplitude and the phase of the output evaluation signal which are obtained by output signal measuring unit 165. Data, which are obtained by evaluator 166, of the power dependency of the amplitude distortion and the phase distortion of system 1 under test are stored in distortion storage 167.

If the phase of the input signal does not depend on the power, then the phase of the input signal is not measured, an the phase of the output signal may be used directly as phase $\theta(P_{in})$.

Variable/function storage 168 stores information of a probability density function p(r) of the power/average power ratio r of a desired modulated signal. The information of probability density function p(r) is the same as described in detail in the first embodiment.

Integrator 169 performs the integration included in the equation (10), for example, using the data, read from distortion storage 167, of the power dependency of the amplitude distortion and the phase distortion of system 1 under test and the information, read from variable/function storage 168, of the probability density function p(r) of the power/average power ratio r of the desired modulated signal. EVM value calculator 170 calculates the square root of the integral obtained by integrator 169 according to the equation (10), for example, thereby determining an EVM value. EVM value display 171 displays the EVM value obtained by EVM value calculator 170.

8th Embodiment

According to an eighth embodiment of the present invention, a measuring device employs an EVM evaluating method referred to above. EVM value evaluating device 176 having measuring unit 172, storage unit 173, data processor 174, and output unit 175, which is shown in the seventh embodiment, may be divided into a plurality of devices.

Figure 18:
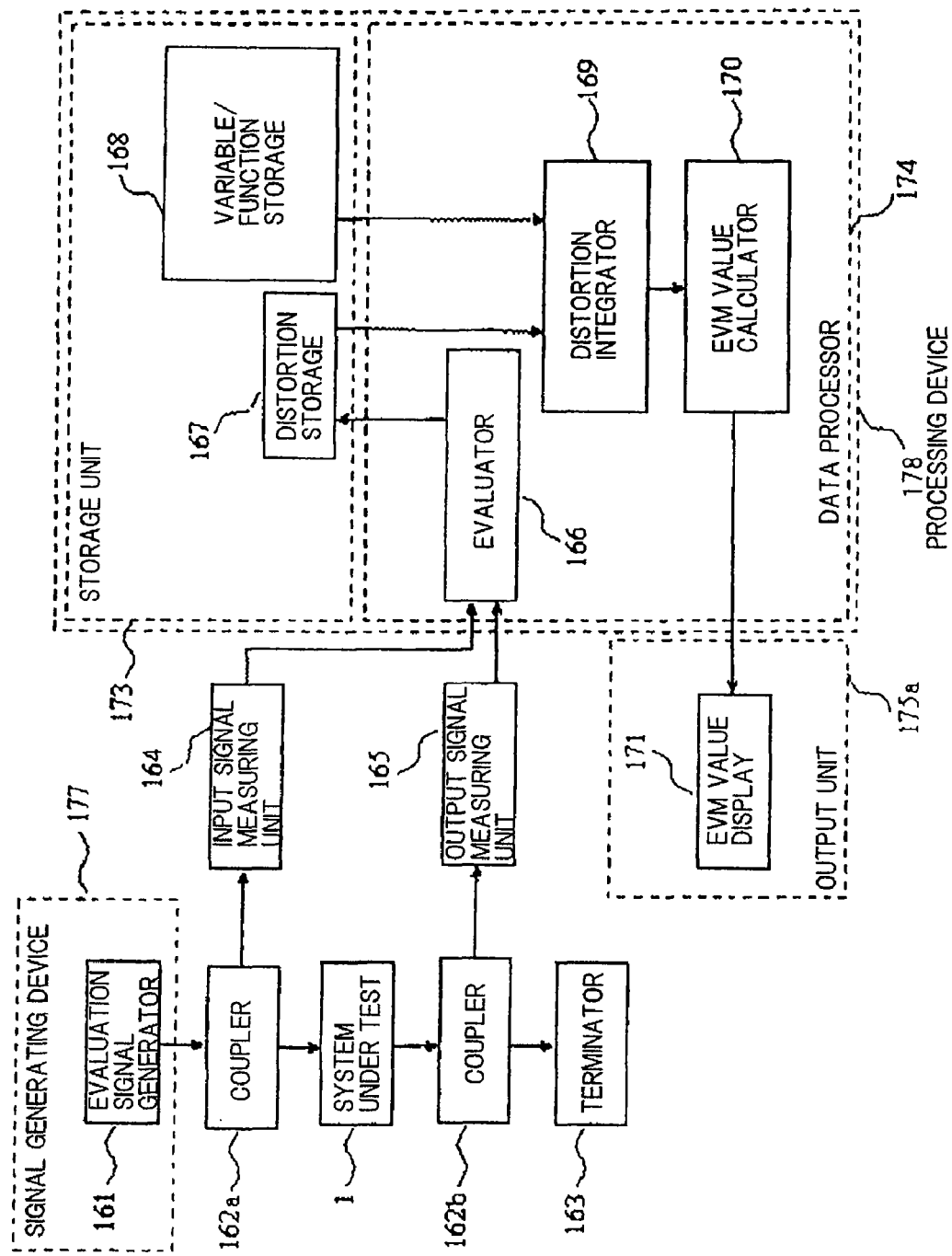
FIG. 18 is a block diagram showing an arrangement of a measuring device according to an eighth embodiment.

FIG. 18 is a block diagram showing an arrangement of a measuring device according to an eighth embodiment. As shown in FIG. 18, according to the eighth embodiment, EVM value evaluating device 176 according to the seventh embodiment is divided into processing device 178 having storage unit 173 and data processor 174, output unit 175, input signal measuring unit 164, and output signal measuring unit 165. According to the eighth embodiment, evaluator 166 is included in data processor 174. Details of the operation of the measuring device according to the eighth embodiment are the same as those of the operation of the measuring device according to the seventh embodiment.

In the seventh and eighth embodiments, amplitude and phase distortions are measured, and an EVM value involving those distortions is evaluated. The present invention, however, it not limited to such a process. Either one of an amplitude distortion and a phase distortion may be evaluated, and an EVM value may be evaluated based on the evaluated distortion.

An EVM value involving only an amplitude distortion based on the evaluated power dependency of the amplitude distortion may be calculated by data processor 174 according to the equation (17), (18), or (19), for example. An EVM value involving only a phase distortion based on the evaluated power dependency of the phase distortion may be calculated by data processor 174 according to the equation (20) or (21), for example.

According to the present invention, therefore, the effect that an amplitude distortion and a phase distortion have on an EVM value can quantitatively be evaluated and compared.

Figure 4:
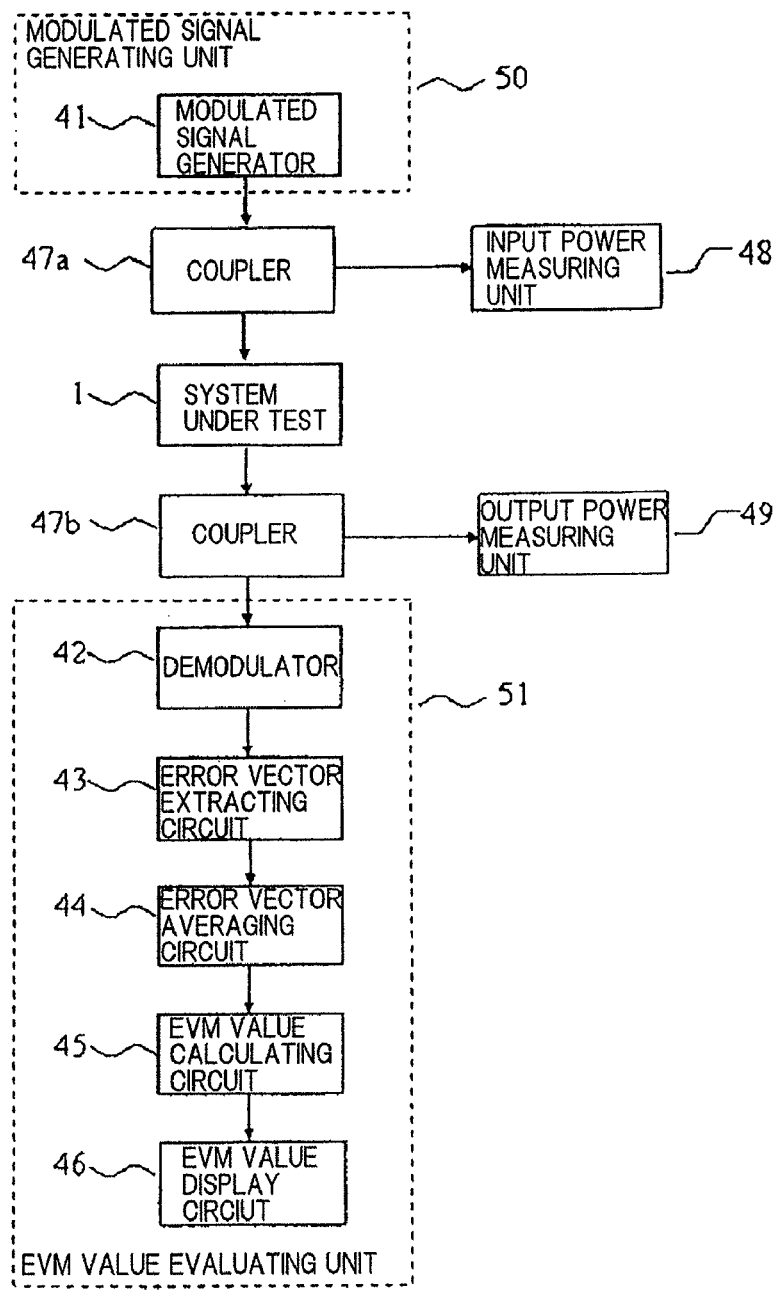
FIG. 4 is a block diagram showing an arrangement of a conventional measuring device with a function to evaluate an EVM value.

According to the conventional art, EVM value evaluating unit 51 including demodulator 42 as shown in FIG. 4 has been required for EVM evaluation, in addition to the measuring device which employs a sine wave as an evaluation signal for obtaining basic characteristics such as a gain and a saturated output. However, the measuring devices according to the seventh and eighth embodiments are capable of evaluating an EVM value though they do not have a demodulator and do not correspond to a modulated signal. Consequently, a measuring device corresponding to a sine wave which is used to evaluate basic characteristics such as a gain and a saturated output may be used as a measuring device for evaluating an EVM value.

According to the present invention, therefore, since a measuring device used to evaluate basic characteristics can be used as a measuring device for evaluating an EVM value, the cost required to introduce an evaluating device is reduced, and the time required for measurements is shortened.

According to the seventh and eighth embodiments, as described above, since a measuring circuit free of a demodulator is capable of EVM evaluation, EVM evaluation can be realized by a measuring device corresponding to a sine wave which is used to evaluate basic characteristics such as a gain and a saturated output. Thus, the cost required to introduce a device for evaluation and measurement is reduced, and the time required for measurements is shortened.

9th Embodiment

Figure 19:
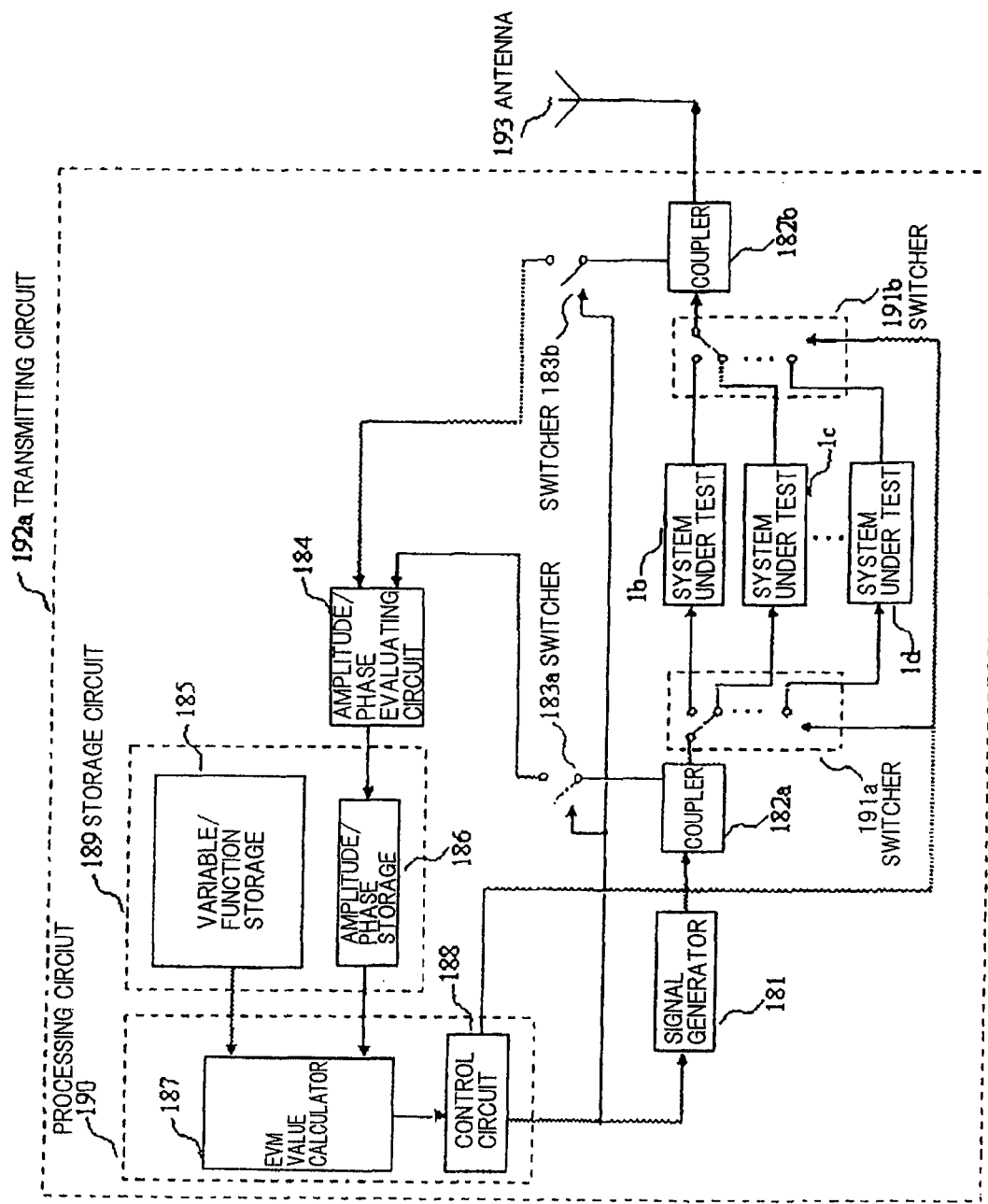
FIG. 19 is a block diagram showing an arrangement of a communication circuit according to a ninth embodiment.

According to a ninth embodiment of the present invention, a communication circuit employs an EVM evaluating method referred to above. FIG. 19 is a block diagram showing an arrangement of a communication circuit according to a ninth embodiment. As shown in FIG. 19, transmitting circuit 192a comprises systems 1b, 1c, 1d under test, signal generator 181, couplers 182a, 182b, switchers 183a, 183b, 191a, 191b, amplitude/phase evaluating circuit 184, storage circuit 189, and processing circuit 190. Storage circuit 189 has variable/function storage 185 and amplitude/phase storage 186. Processing circuit 190 has EVM value calculator 187 and control circuit 188.

In the ninth embodiment shown in FIG. 19, signal generator 181 is compatible with a plurality of communication processes, and has a function to generate modulated signals according to the communication processes.

Systems 1b, 1c, 1d . . . under test of transmitting circuit 192a comprise respective circuits which are compatible with the respective communication processes. For example, system 1b under test is compatible with a communication process represented by wireless LAN standards IEEE802.11a, and system 1c under test is compatible with a different communication process represented by cellular phone standards GSM/EDGE. Alternatively, one system under test may be compatible with a plurality of communication processes. The systems under test may comprise a circuit having any function in a communication device, e.g., a transmission amplifier.

Transmitting circuit 192a operates in a period for transmitting a modulated signal through a system under test compatible with a desired modulated signal process and antenna 198, and a period for evaluating EVM values of systems 1b, 1c, 1d . . . under test. In the period for evaluating EVM values of systems 1b, 1c, 1d . . . under test, switchers 183a, 183b are rendered conductive to connect couplers 182a, 182b to amplitude/phase evaluating circuit 184. Switchers 183a, 183b are controlled by control circuit 188.

At least one of systems 1b, 1c, 1d . . . under test is selected and connected by switchers 191a, 191b to a line leading to signal generator 181 and an output terminal of transmitting circuit 192a, e.g., a line leading to antenna 193. Switchers 191a, 191b are controlled by control circuit 188.

In the period for evaluating an EVM value, signal generator 181 generates a signal for EVM evaluation. The evaluation signal may be any signal insofar as it can measure the power dependency of the gain G and the phase θ at the carrier frequency of the desired modulated signal or at a frequency close to the carrier frequency. For example, the evaluation signal may be a signal for sweeping the amplitude of a sine wave at a rate close to the amplitude varying rate of the modulated wave.

In the period for evaluating an EVM value, the evaluation signal input to the system under test is sent via coupler 182a to amplitude/phase evaluating circuit 184, and the evaluation signal output from the system under test is sent via coupler 182b to amplitude/phase evaluating circuit 184.

Amplitude/phase evaluating circuit 184 evaluates a gate and a phase of the system under test from the signals input to and output from the system under test.

Figure 20A:
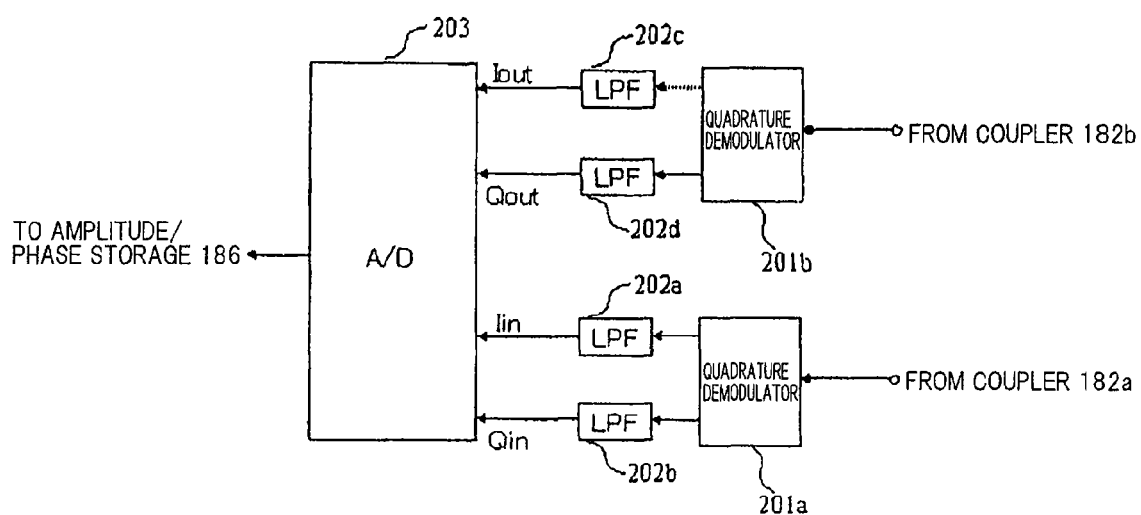
FIG. 20A is a block diagram showing an arrangement of an amplitude/phase evaluating circuit in the communication circuit according to the ninth embodiment.
Figure 20B:
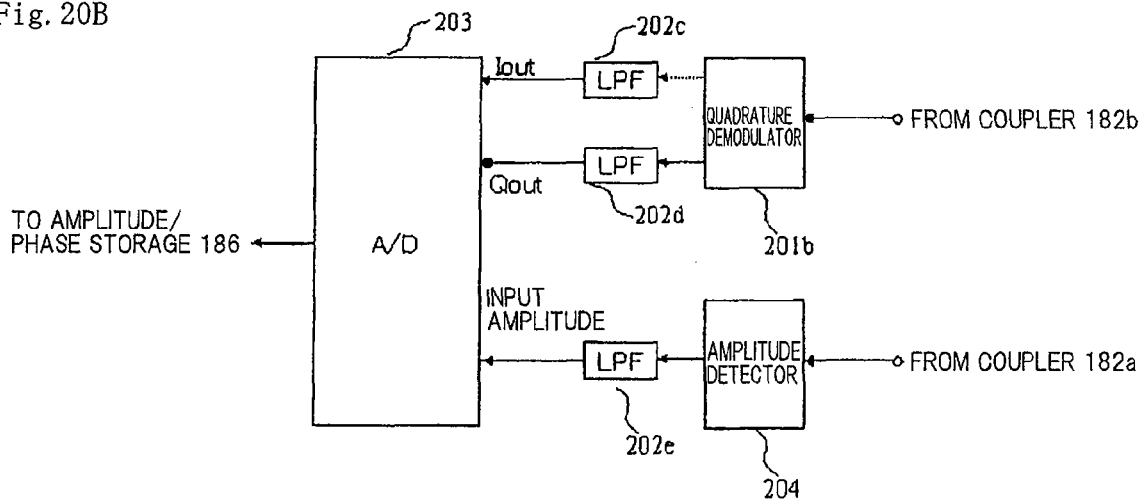
FIG. 20B is a block diagram showing another arrangement of the amplitude/phase evaluating circuit in the communication circuit according to the ninth embodiment.

FIGS. 20A and 20B are block diagrams showing arrangements of the amplitude/phase evaluating circuit in the communication circuit according to the ninth embodiment. In the arrangement shown in FIG. 20A, amplitude/phase evaluating circuit 184 comprises quadrature demodulators 201a, 201b, low-pass filters 202a, 202b, 202c, 202d, and analog-to-digital converter 203. Quadrature demodulator 201a is connected to coupler 182a through switcher 183a, and quadrature demodulator 201b is connected to coupler 182b through switcher 183b.

Quadrature demodulator 201a determines an in-phase channel signal (Iin) and a quadrature channel signal (Qin) of the envelope curve of the evaluation signal input to the system under test. The determined signals are sent to analog-to-digital converter 203 through antialias low-pass filters 202a, 202b.

Similarly, quadrature demodulator 201b determines an in-phase channel signal (Iout) and a quadrature channel signal (Qout) of the envelope curve of the signal output from the system under test. The determined signals are sent to analog-to-digital converter 203 through antialias low-pass filters 202c, 202d.

Analog-to-digital converter 203 converts the envelope-curve signals Iin, Qin of the evaluation signal and the envelope-curve signals Iout, Qout of the output signal into digital signals, and sends the digital signals to amplitude/phase storage 186. Amplitude/phase storage 186 stores information of the signals obtained by amplitude/phase evaluating circuit 184.

EVM value calculator 187 reads the information of the envelope-curve signals Iin, Qin, Iout, Qout from amplitude/phase storage 186, and calculates amplitudes and phases of the evaluation signals input to and output from the system under test. For example, an amplitude and a phase of the evaluation signal input to the system under test are calculated using the envelope-curve signals Iin, Qin. The amplitude is determined according to $(Iin^2+Qin^2)^{1/2}$, and the phase is determined according to Arctan(Qin/Iin). An amplitude and a phase of the output signal are similarly calculated using the envelope-curve signals Iout, Qout. A gain $G(P_{in})$ is obtained from the ratio of the amplitude of the input signal to the amplitude of the output signal, and a phase $\theta(P_{in})$ is obtained from the phase difference between the input and output signals. EVM value calculator 187 acquires data of the power dependency of the gain and the phase of the system under test in the manner described above.

The path from the system under test to amplitude/phase evaluating circuit 184 may suffer a passive loss and a phase rotation which are independent of the power. The loss or the phase rotation may differ between the path for the evaluation signal and the path for the output signal. In this case, a gain calculated from the envelope-curve signals Iin, Qin, Iout, Qout produced by amplitude/phase evaluating circuit 184 is of a value which is a multiple by a constant of the gain of the system under test. Similarly, a phase calculated from the envelope-curve signals is of a value which deviates a certain constant from the phase of the system under test.

As already described above with respect to the equation (10) for evaluating an EVM value in the first embodiment, it is possible to evaluate an EVM value using $G(P_{in})/G'$ instead of the gain $G(P_{in})$ included in the equation (10) and $\theta(P_{in})-\theta$ instead of the phase $\theta(P_{in})$ included in the equation (10). $G'$ and $\theta'$ represent desired constants.

Unless the loss and the phase rotation in the path from the system under test to amplitude/phase evaluating circuit 184 have power dependency, the evaluation of an EVM value is not affected by the values of the loss and the phase rotation. It can thus be seen that the gain and the phase calculated from the envelope-curve signals produced by amplitude/phase evaluating circuit 184 may be used to evaluate an EVM value. However, if the power levels of the evaluation signal input to the system under test and the output signal from the system under test are to be associated with the EVM value, then it is desirable to determine in advance the loss in the path from the system under test to amplitude/phase evaluating circuit 184.

In the power dependency of the phase of the input signal is sufficiently small and its effect is negligible, then it is not necessary to measure the phase of the input signal, and the phase of the output signal may be used directly as the phase $\theta(P_{in})$. In this case, amplitude/phase evaluating circuit 184 may be of an arrangement shown in FIG. 20B. Amplitude/phase evaluating circuit 184 shown in FIG. 20B is different from amplitude/phase evaluating circuit 184 shown in FIG. 184 in that quadrature demodulator 201a for demodulating the input signal is replaced with amplitude detector 204.

When a signal of excessive power is input to quadrature demodulators 201a, 201b shown in FIG. 20A or amplitude detector 204 shown in FIG. 20B, an amplitude distortion or a phase distortion which has power dependency is possibly generated. Therefore, it is desirable to take a measure for preventing such a signal of excessive power from being input to quadrature demodulators 201a, 201b or amplitude detector 204. According to an example, a coupling quantity of couplers 182a, 182b may be designed appropriately. According to another example, attenuators may be provided in stages prior to quadrature demodulators 201a, 201b.

Variable/function storage 168 stores information of a probability density function p(r) of the power/average power ratio r of a desired modulated signal. The information of probability density function p(r) is the same as described in detail in the first embodiment.

EVM value calculator 187 calculates an EVM value of the system under test which is compatible with the desired modulating process according to the equation (10), for example, using the data, read from amplitude/phase storage 186, of the power dependency of the gain and the phase which has been calculated from the envelope-curve signals, and the information, read from variable/function storage 168, of the probability density function p(r) of the power/average power ratio r of the desired modulated signal.

Transmitting circuit 192a applies the EVM evaluation based on the above operation to systems 1b, 1c, 1d... under test to evaluate respective EVM values, for thereby determining whether EVM value standards are achieved at desired output power according the modulating processes corresponding to the respective systems under test, or not.

Therefore, transmitting circuit 192a, which is capable of selecting one of a plurality of modulating processes, is capable of selecting a modulating process which satisfies EVM value standards and has best characteristics such as communication rate and output power, and a system under test which is compatible with the modulating process, based on the evaluated EVM values of systems 1b, 1c, 1d... under test which have been calculated by EVM value calculator 187.

In the period for transmitting a modulated signal through the system under test and antenna 193, control circuit 188 controls signal generator 181 to generate a modulated signal corresponding to the modulating process selected as described above. Control circuit 188 also controls switchers 191a, 191b to connect the system under test which is compatible with the modulating process to the line leading to signal generator 181 and the output terminal of transmitting circuit 192, i.e., the line leading to antenna 193. Furthermore, control circuit 188 controls switchers 183a, 183b to disconnect couplers 182a, 182b from amplitude/phase evaluating circuit 184.

Transmitting circuit 192a is thus capable of selecting a modulating process which satisfies EVM value standards and has best characteristics such as communication rate and output power, and a system under test which is compatible with the modulating process, and transmitting signals.

Transmitting circuit 192a can also easily evaluate the dependency of an EVM value in a desired modulated signal on the average power, by changing the average power and making calculations according to the above EVM evaluating method. Therefore, control circuit 188 can control the average power of the output signal of signal generator 181 for allowing the output signal of the system under test to satisfy the EVM value standards, based on the evaluated dependency of the desired modulated signal on the average power.

Transmitting circuit 192a which is illustrated is an example of a circuit for realizing a desired function, and is not limited to the circuit shown in FIG. 19. Though objects to be selected one at a time depending on a modulating process are the systems to be measured in the illustrated embodiment, the objects to be selected depending on a modulating process may include components other than systems 1b, 1c, 1d... under test. For example, the present invention is applicable to an arrangement wherein a plurality of antennas compatible with respective modulating processes may be provided, and one of the antennas may be selected depending on a modulating process.

There are a plurality of systems under test in the illustrated embodiment. However, the present invention is not limited to such a plurality of systems under test. The present invention is applicable to a circuit arrangement in which transmitting circuit 192a has a single system under test which is compatible with a plurality of modulating processes, an EVM value is evaluated from the data of the power dependency of the gain and the phase corresponding to each modulating process and the data of the probability density function p(r), and an optimum modulating process is selected based on the evaluated EVM value.

In the circuit arrangement shown in FIG. 19, the calculation of an EVM value using digital processing circuit 190 is assumed. However, the present invention is not limited to the use of digital processing circuit 190. Processing circuit 190 or a portion thereof may be replaced with an analog circuit having the same function, and the integration included in the EVM value calculating process may be performed by an analog integrator.

Figure 5:
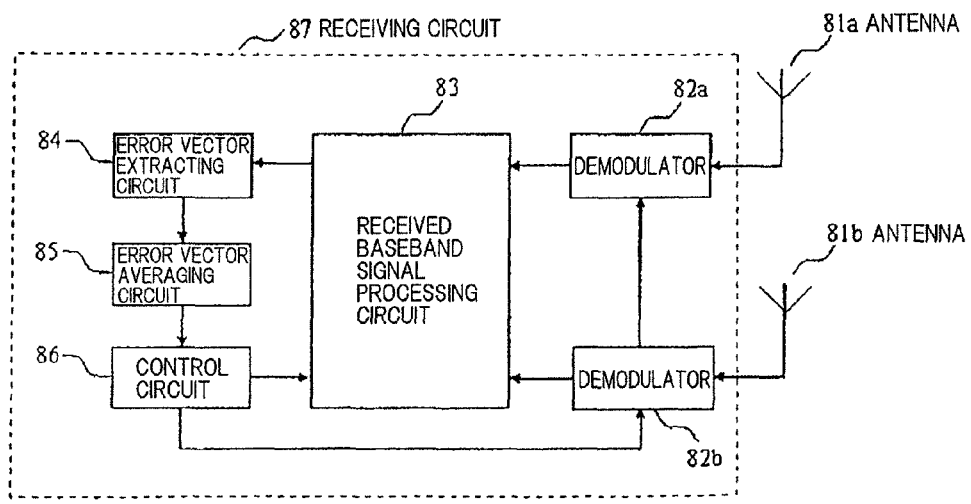
FIG. 5 is a block diagram of a conventional reception circuit having a function to select a reception mode based on the evaluated EVM value.

The conventional circuit shown in FIG. 5 requires dedicated demodulators compatible with respective modulating processes. Each of the dedicated demodulators compatible with respective modulating processes needs a quadrature demodulator, an amplitude detector, low-pass filters, and an analog-to-digital converter included in amplitude/phase evaluating circuit 184 shown in FIGS. 20A, 20B, and, in addition, a dedicated processing circuit compatible with each modulating process. For example, a demodulating circuit compatible with OFDM modulation needs a circuit for performing discrete Fourier transform and serial/parallel conversion. The additional circuit results in not only an increase in the circuit scale, but also a large burden on the man-hours required for designing and manufacturing processes. Particularly, if there are many types of modulating processes to be handled, then the burden is very large.

According to the ninth embodiment shown in FIG. 19, since amplitude/phase evaluating circuit 184 shown in FIGS. 20A, 20B is capable of evaluating an EVM value regardless of modulating processes, the circuit arrangement is simple and the burden imposed on processes for designing and manufacturing the circuit is reduced.

The conventional circuit shown in FIG. 5 needs to average the power levels of very many error vectors. For example, JP-A No. 2004-56499 discloses that the power levels of error vectors are averaged for 2000 through 3000 frames. However, averaging the power levels of such many error vectors results in an increased amount of calculations and requires a large-scale storage circuit for the calculations. As a consequence, the conventional art has invited a large circuit scale and a power consumption increase.

The communication circuit shown in FIG. 19 is capable of calculating an EVM value accurately if gain and phase data with the power levels at about 40 points are available. According to the present invention, therefore, an EVM value can be calculated with a small amount of data, with the results that a large-scale storage circuit is not required, the circuit scale is reduced, and the power consumption is lowered.

10th Embodiment

Figure 21:
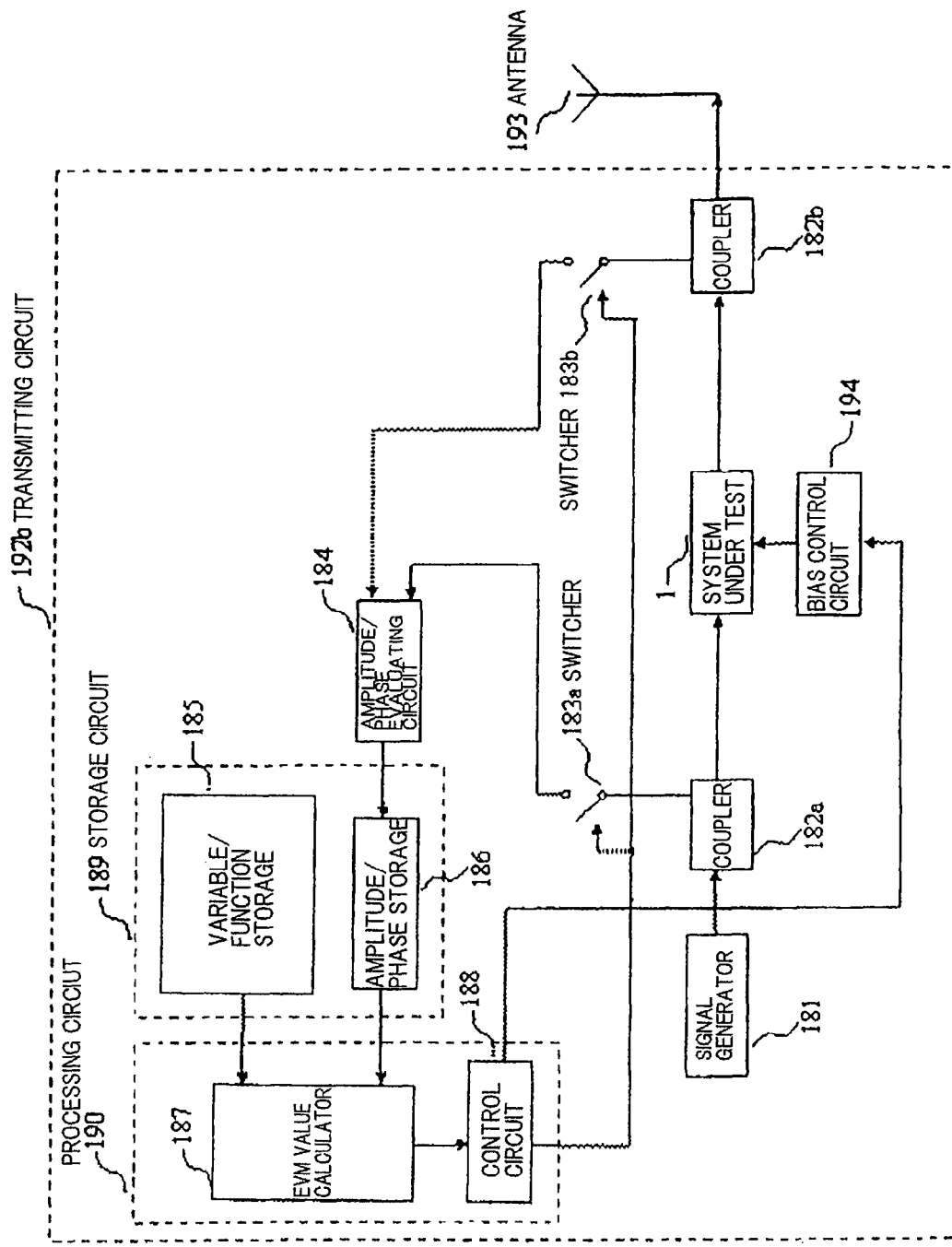
FIG. 21 is a block diagram showing an arrangement of a communication circuit according to a tenth embodiment.

According to a tenth embodiment of the present invention, another communication circuit employs an EVM evaluating method referred to above. FIG. 21 is a block diagram showing an arrangement of a communication circuit according to a tenth embodiment. As shown in FIG. 21, transmitting circuit 192b comprises system 1 under test, signal generator 181, couplers 182a, 182b, switchers 183a, 183b, amplitude/phase evaluating circuit 184, storage circuit 189, processing circuit 190, and bias control circuit 194. Storage circuit 189 has variable/function storage 185 and amplitude/phase storage 186. Processing circuit 190 has EVM value calculator 187 and control circuit 188.

Transmitting circuit 192b according to the tenth embodiment shown in FIG. 21 differs from transmitting circuit 192a according to the ninth embodiment shown in FIG. 19 in that it additionally has bias control circuit 194. Bias control circuit 194 controls a basing condition for system 1 under test according to an instruction from control circuit 188. In transmitting circuit 192b shown in FIG. 21, a single system under test is employed and switchers 191a, 191b are dispensed with for the sake of brevity. However, transmitting circuit 192b may have a plurality of systems under test and switchers 191a, 191b, as with transmitting circuit 192a shown in FIG. 19.

Transmitting circuit 192b thus arranged according to the tenth embodiment performs EVM evaluation in the same manner as with the ninth embodiment. According to the present embodiment, based on an EVM value due to a distortion of system 1 under test, which has been calculated by EVM value calculator 187, control circuit 188 controls the biasing condition for system 1 under test through bias control circuit 194.

Generally, the distortions of system 1 under test depend on the biasing condition. Therefore, both desired distortion characteristics and power consumption can be achieved by appropriately controlling the biasing condition of system 1 under test.

Figure 22:
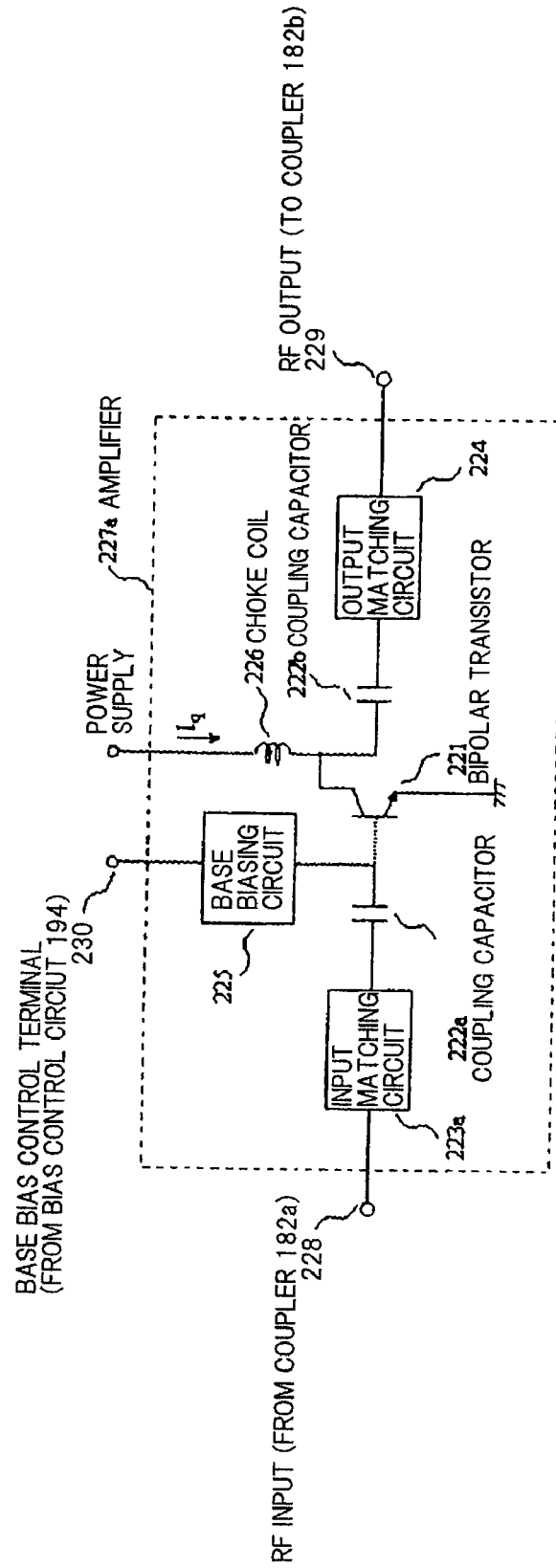
FIG. 22 is a schematic circuit diagram showing an arrangement of an amplifier as an example of a system under test.

FIG. 22 is a schematic circuit diagram showing an arrangement of an amplifier as an example of a system under test. Amplifier 227a shown in FIG. 22 comprises bipolar transistor 221, coupling capacitors 222a, 222b, input matching circuit 223a, output matching circuit 224, base biasing circuit 225, and choke coil 226. Amplifier 227a has RF input terminal 228 connected to coupler 182a, RF output terminal 229 to coupler 182b, and base bias control terminal 230 to bias control circuit 194.

Base biasing circuit 225 controls a static current $I_q$ flowing through bipolar transistor 221 depending on the potential at base bias control terminal 230. Base biasing circuit 225 may, for example, be a circuit shown in FIG. 3 of IEEE GaAs IC Symposium Digest, pp. 75-78, 2001.

Figure 23:
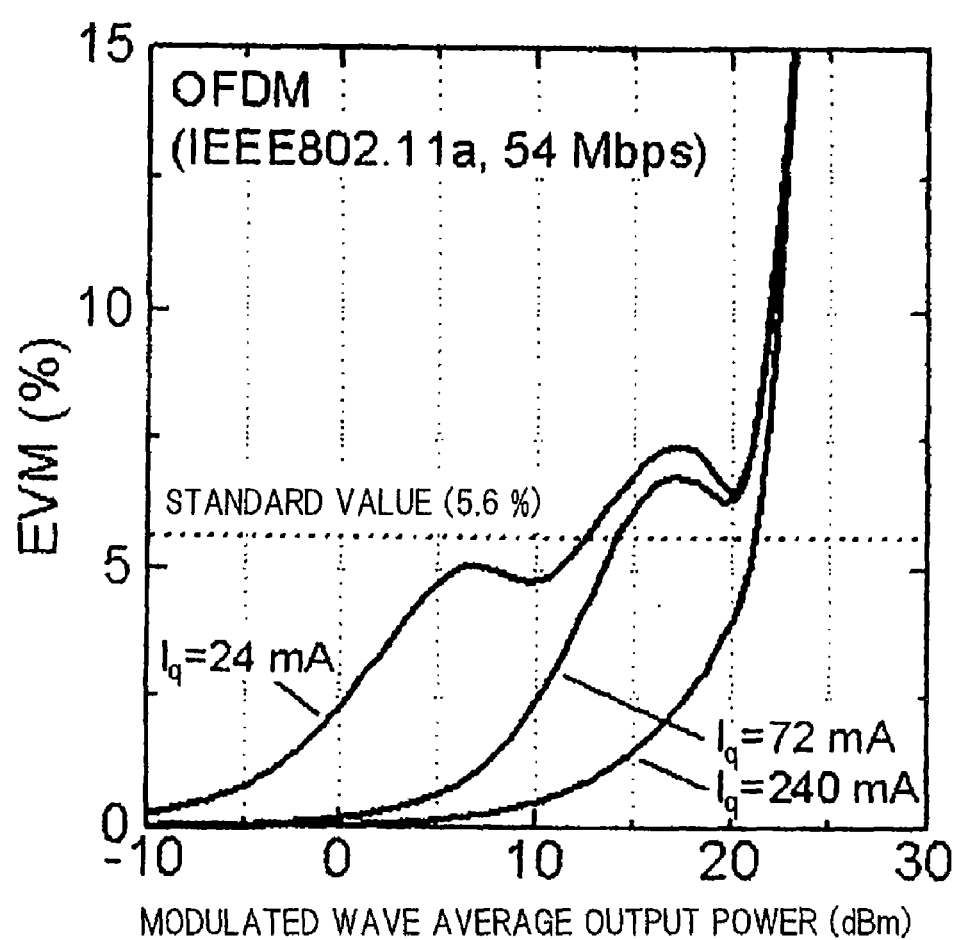
FIG. 23 is a graph showing the simulated power dependency of EVM values in a 54 Mbps mode according to the wireless LAN standards IEEE802.11a at different static currents of the amplifier shown in FIG. 22.

FIG. 23 is a graph showing the simulated power dependency of EVM values in a 54 Mbps mode according to the wireless LAN standards IEEE802.11a at different static currents of the amplifier shown in FIG. 22. It can be seen from FIG. 23 that the EVM value is lower as the static current $I_q$ is smaller. Therefore, if the static current $I_q$ is increased, the EVM value standards (EVM<5.6%) in the 54 Mbps mode according to the wireless LAN standards IEEE802.11a is achieved at a higher output power level. From the standpoint of reducing power consumption, the static current $I_q$ should preferably be reduced as much as possible.

In transmitting circuit 192b with amplifier 227a as system 1 under test, bias control circuit 194 controls the potential at base bias control terminal 230 while referring to the evaluated EVM value, thereby controlling the static current $I_q$ so as to be of a minimum value satisfying the EVM value standards at a desired output power level.

The modulating process according to the wireless LAN IEEE802.11a has been described by way of example above. The control process illustrated above is also applicable to other modulating processes. Transmitting circuit 192b and amplifier 227a are an example of circuits for realizing a desired function, and the present invention is not limited to the circuit arrangements shown in FIGS. 21, 22.

11th Embodiment

Figure 24:
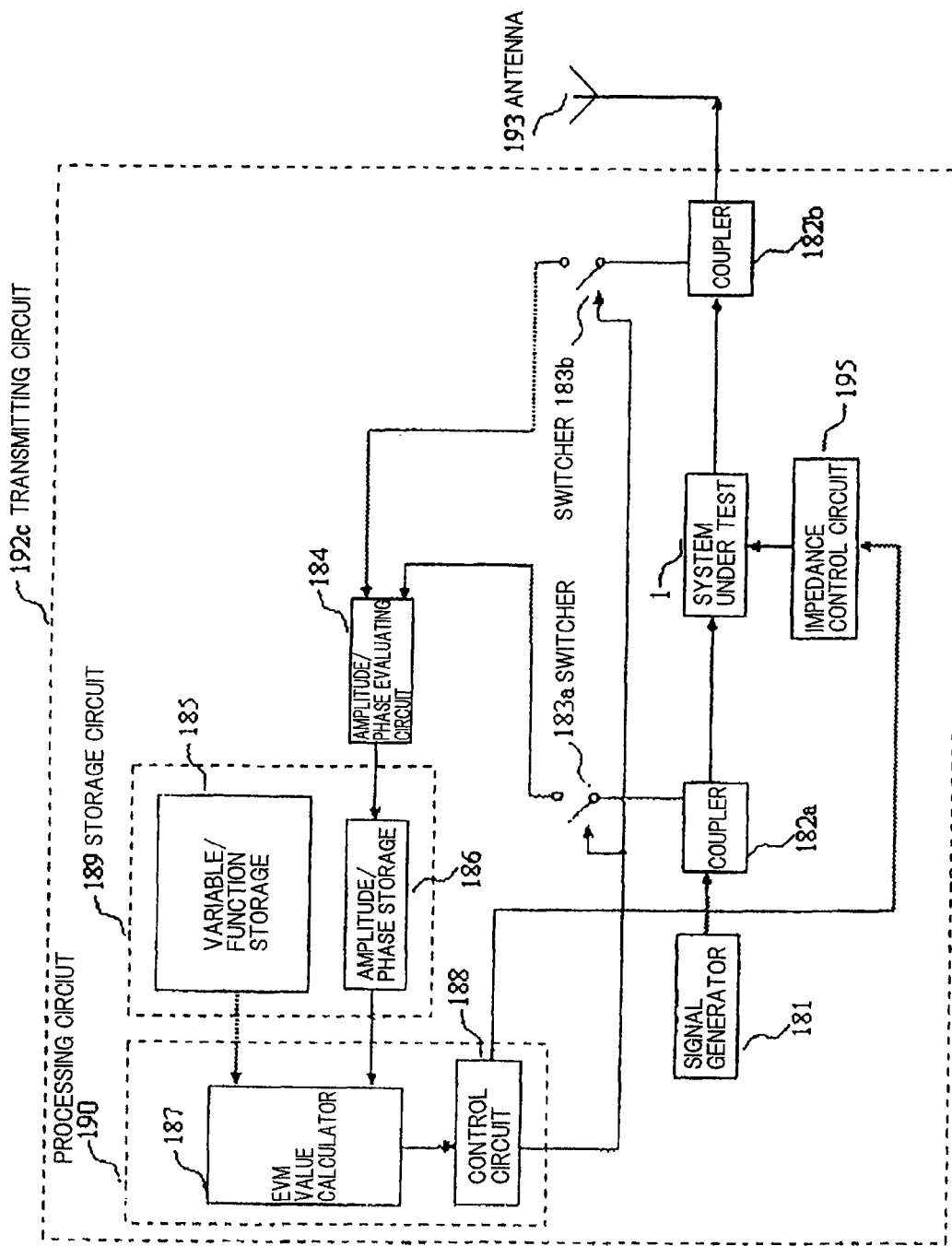
FIG. 24 is a block diagram showing an arrangement of a communication circuit according to an eleventh embodiment.

According to an eleventh embodiment of the present invention, still another communication circuit employs an EVM evaluating method referred to above. FIG. 24 is a block diagram showing an arrangement of a communication circuit according to an eleventh embodiment. As shown in FIG. 24, transmitting circuit 192c comprises system 1 under test, signal generator 181, couplers 182a, 182b, switchers 183a, 183b, amplitude/phase evaluating circuit 184, storage circuit 189, processing circuit 190, and impedance control circuit 195. Storage circuit 189 has variable/function storage 185 and amplitude/phase storage 186. Processing circuit 190 has EVM value calculator 187 and control circuit 188.

Transmitting circuit 192c according to the eleventh embodiment shown in FIG. 24 differs from transmitting circuit 192b according to the tenth embodiment shown in FIG. 21 in that it has impedance control circuit 195 in place of bias control circuit 194. Impedance control circuit 195 controls an impedance control condition for system 1 under test according to an instruction from control circuit 188.

Other details of transmitting circuit 192c according to the eleventh embodiment are the same as those of transmitting circuit 192b according to the tenth embodiment. In transmitting circuit 192c according to the eleventh embodiment, a single system under test is also employed for the sake of brevity. However, transmitting circuit 192c may have a plurality of systems under test and switchers 191a, 191b, as with transmitting circuit 192a shown in FIG. 19.

Transmitting circuit 192c thus arranged according to the eleventh embodiment performs EVM evaluation in the same manner as with transmitting circuit 192a shown in FIG. 19 and transmitting circuit 192b shown in FIG. 21. According to the present embodiment, based on an EVM value due to a distortion of system 1 under test, which has been calculated by EVM value calculator 187, control circuit 188 controls an impedance condition for system 1 under test through impedance control circuit 194.

Generally, the distortions of system 1 under test depend on the impedance condition. Therefore, distortion characteristics can be improved by appropriately controlling the load impedance condition of system 1 under test.

Figure 25:
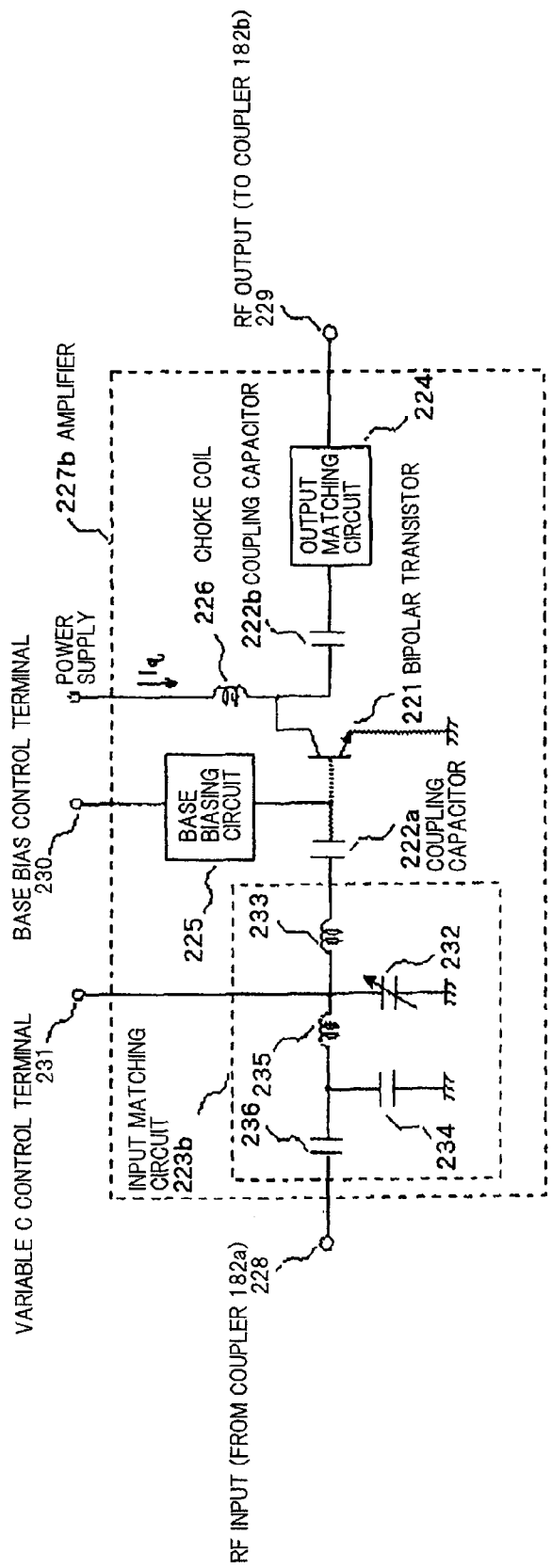
FIG. 25 is a schematic circuit diagram showing an arrangement of an amplifier as an example of a system under test.

FIG. 25 is a schematic circuit diagram showing an arrangement of an amplifier as an example of a system under test. Amplifier 227b shown in FIG. 25 comprises bipolar transistor 221, coupling capacitors 222a, 222b, input matching circuit 223b, output matching circuit 224, base biasing circuit 225, and choke coil 226. Amplifier 227b has RF input terminal 228 connected to coupler 182a, RF output terminal 229 to coupler 182b, and base bias control terminal 230 to bias control circuit 194.

Amplifier 227b shown in FIG. 25 differs from amplifier 227a shown in FIG. 22 in that it has input matching circuit 223b in place of input matching circuit 223a.

Input matching circuit 223b comprises inductive elements 233, 235, capacitive elements 234, 236, and variable capacitive element 232. The capacitance value of variable capacitive element 232 is controlled by a potential at variable capacitor control terminal 231 which is given from variable capacitor control terminal 231. Variable capacitive element 232 may be any element whose capacitance value can be controlled by a potential, and may comprise a varactor diode or an MEMS (microelectromechanical systems) element.

According to the present embodiment, the potential at variable capacitor control terminal 231 is controlled to control the input matching impedance of bipolar transistor 221.

For the sake of brevity, the impedance of only input matching circuit 223b is variable. However, the impedance of output matching circuit 224 may be made variable.

Figure 26:
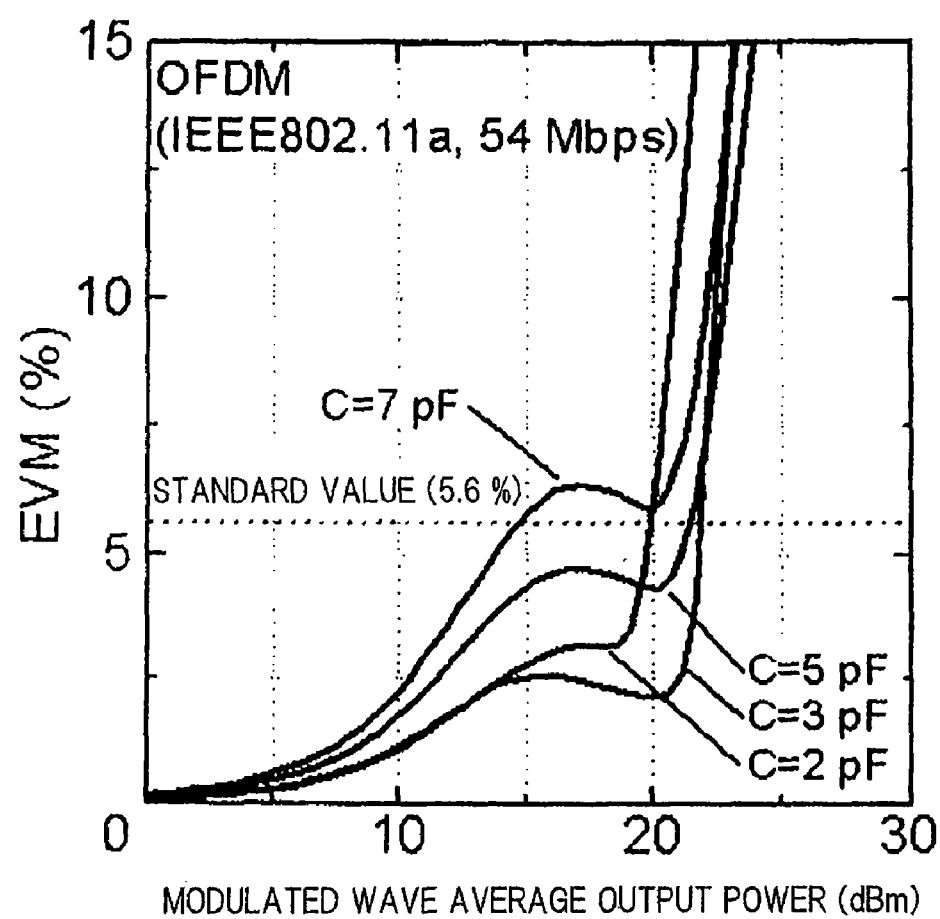
FIG. 26 is a graph showing the simulated power dependency of EVM values in the 54 Mbps mode according to the wireless LAN standards IEEE802.11a at different capacitance values of a variable capacitive element of the amplifier shown in FIG. 25.

FIG. 26 is a graph showing the simulated power dependency of EVM values in a 54 Mbps mode according to the wireless LAN standards IEEE802.11a at different capacitance values of a variable capacitive element of the amplifier shown in FIG. 25. It can be seen from FIG. 26 that the EVM value is the lowest when the capacitance value is 3 pF. This indicates that the input matching impedance of bipolar transistor 221 is optimized with respect to EVM characteristics by changing the value of variable capacitive element 232.

In transmitting circuit 192b with amplifier 227b as system 1 under test, impedance control circuit 195 controls the potential at variable capacitive element control terminal 231 in order to improve the distortion characteristics while referring to the evaluated EVM value. This function is particularly effective in compensating, through impedance control, for characteristic degradations caused by characteristic variations that have occurred when the circuit elements of amplifier 227b are manufactured, temperature changes or aging of the circuit elements.

The modulating process according to the wireless LAN IEEE802.11a has been described by way of example above. The control process illustrated above is also applicable to other modulating processes. Transmitting circuit 192c and amplifier 227b are an example of circuits for realizing a desired function, and the present invention is not limited to the circuit arrangements shown in FIGS. 24, 25. A circuit different from amplifier 227b shown in FIG. 25 may be used as system 1 under test. In amplifier 227b, variable capacitive element 232 is used to realize an impedance control function. However, a variable resistive element or a variable inductive element may be used as another example.

12th Embodiment

Figure 27:
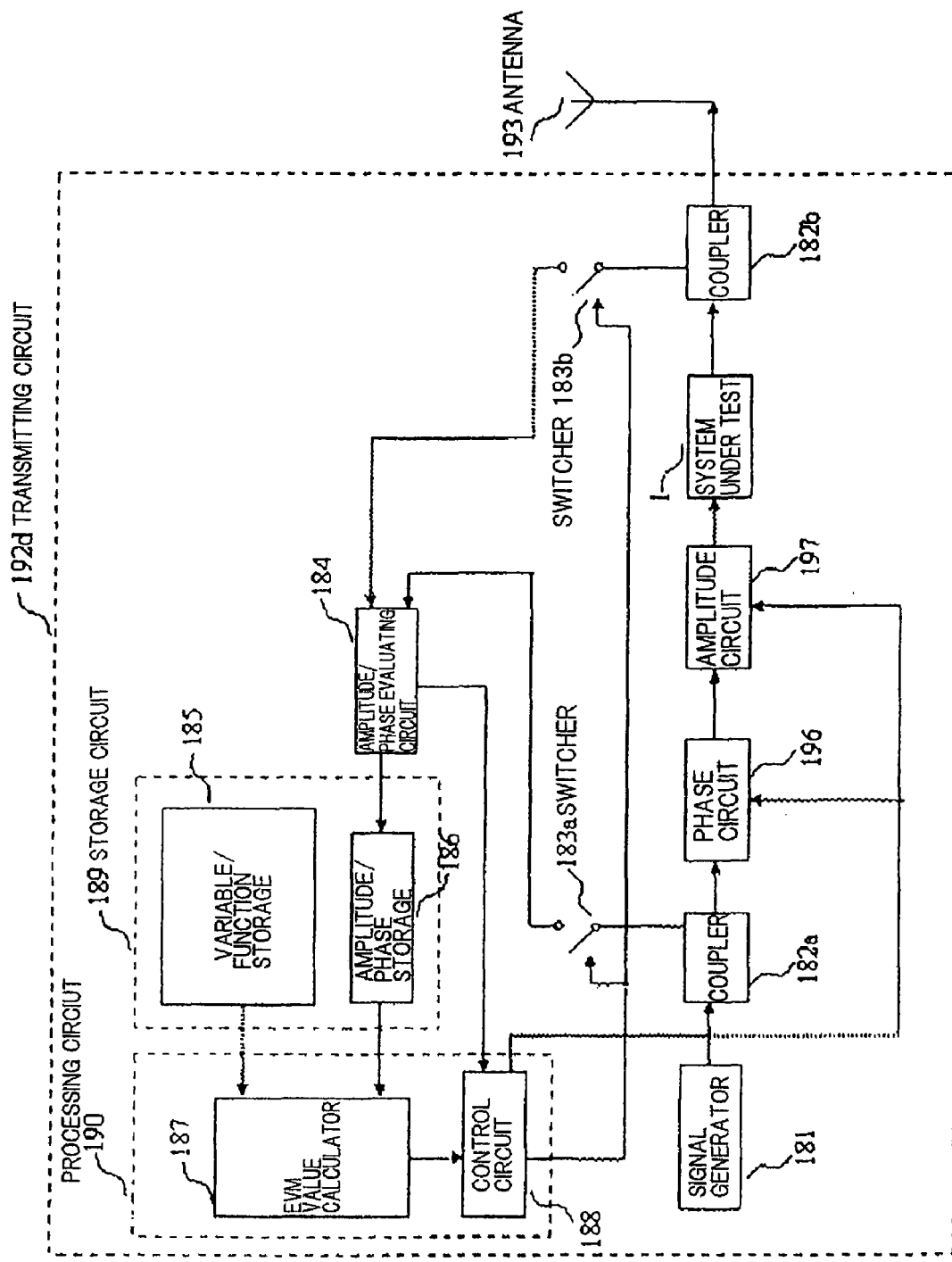
FIG. 27 is a block diagram showing an arrangement of a communication circuit according to a twelfth embodiment.

According to a twelfth embodiment of the present invention, yet another communication circuit employs an EVM evaluating method referred to above. FIG. 27 is a block diagram showing an arrangement of a communication circuit according to a twelfth embodiment. As shown in FIG. 27, transmitting circuit 192d comprises system 1 under test, signal generator 181, couplers 182a, 182b, switchers 183a, 183b, amplitude/phase evaluating circuit 184, storage circuit 189, processing circuit 190, phase circuit 196, and amplitude circuit 197. Storage circuit 189 has variable/function storage 185 and amplitude/phase storage 186. Processing circuit 190 has EVM value calculator 187 and control circuit 188.

Transmitting circuit 192d according to the eleventh embodiment shown in FIG. 27 differs from transmitting circuit 192a according to the ninth embodiment shown in FIG. 19 in that phase circuit 196 and amplitude circuit 197 are newly added. In transmitting circuit 192d shown in FIG. 27, a single system under test is also employed for the sake of brevity. However, transmitting circuit 192d may have a plurality of systems under test and switchers 191a, 191b, as with transmitting circuit 192a shown in FIG. 19.

Transmitting circuit 192d thus arranged according to the twelfth embodiment performs EVM evaluation in the same manner as with transmitting circuit 192a shown in FIG. 19, etc. According to the present embodiment, based on an amplitude distortion and a phase distortion of system 1 under test which have been obtained by amplitude/phase evaluating circuit 184, control circuit 188 controls phase circuit 196 and amplitude circuit 197 to obtain characteristics which are inverse to the amplitude distortion and the phase distortion of system 1 under test.

A process involving an arrangement wherein a circuit having characteristics which are inverse to the amplitude distortion and the phase distortion of system 1 under test is placed in a stage prior to system 1 under test for compensating for distortions is known as a pre-distortion process. For example, details of such a pre-distortion process is shown in Steve C. Cripps, Advanced Techniques in RF Power Amplifier Design, Artech House, pp. 153-195, 2002.

Phase circuit 196 and amplitude circuit 197 may be of any characteristics insofar as they can compensate for the distortions of system 1 under test. For example, a circuit having characteristics for correcting an amplitude distortion (AM/AM conversion) and a phase distortion (AM/PM conversion) due to drain variations as well as an amplitude distortion (AM/AM conversion) and a phase distortion (AM/PM conversion) due to a pure envelope curve may be employed (see JP-A No. 2003-258560).

Figure 6:
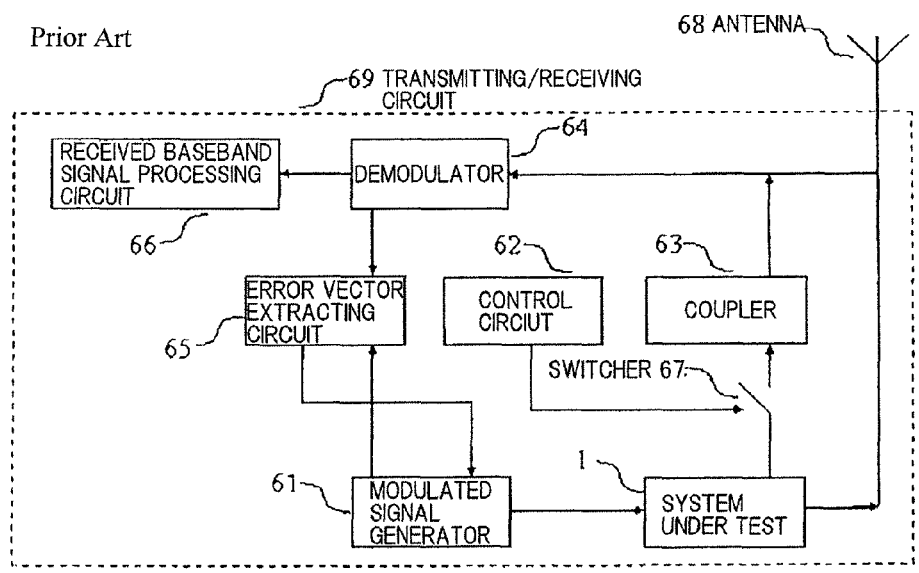
FIG. 6 is a block diagram showing an arrangement of a conventional transmission/reception circuit having a function to generate a modulated signal for correcting a distortion of a system under test, based on the evaluated error vector.

The distortion compensation according to the conventional art shown in FIG. 6 requires a demodulator compatible with a desired modulated signal for distortion compensation. Therefore, the circuit scale is large, and the cost and the power consumption are high. However, the distortion compensation according to the twelfth embodiment does not need a demodulator compatible with a desired modulated signal, and can be realized by a small-scale circuit whose cost and power consumption are low.

Figure 7:
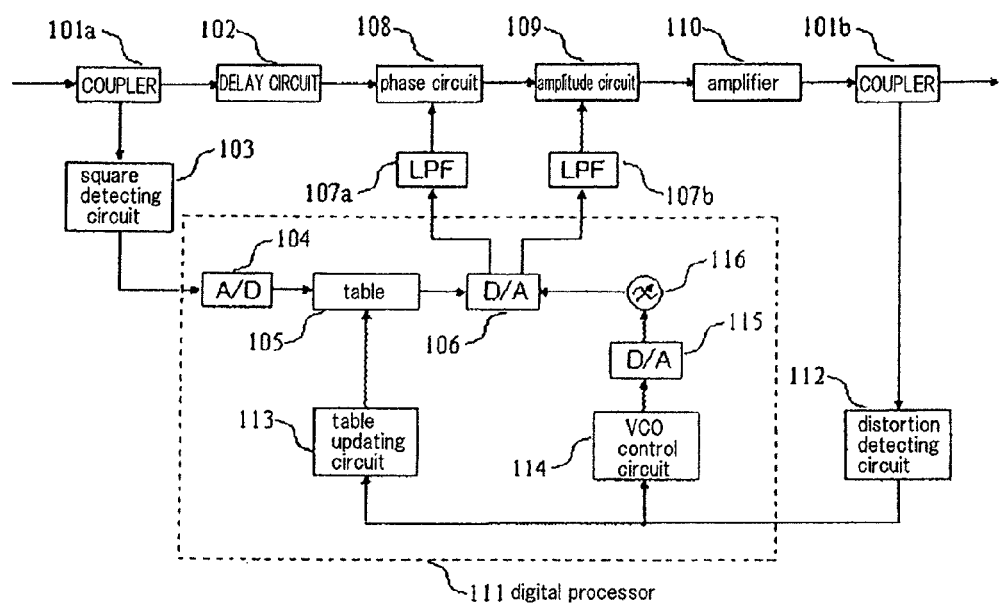
FIG. 7 is a block diagram showing an arrangement of a conventional circuit having a function to correct a distortion of a system under test.

The distortion compensation circuit according to the conventional art shown in FIG. 7 does not have a means for confirming an EVM value. Therefore, the distortion compensation circuit fails to confirm when the EVM value standards are satisfied at a desired output level by distortion correction, and lacks reliability. According to the twelfth embodiment, however, an EVM value can be evaluated easily with a simple circuit as described in the ninth embodiment, making it possible to confirm that the EVM value standards are satisfied at a desired output level.

If the EVM value standards are satisfied at the time, then phase circuit 196 and amplitude circuit 197 may be controlled again. In addition to the control of the phase and the amplitude, the bias control process according to the tenth embodiment and the load impedance control process according to the eleventh embodiment may be used in combination for improving the distortion. Furthermore, the selection of a communication process may be combined for appropriate communications as described in the ninth embodiment.

As described in the second embodiment, the effects that an amplitude distortion and a phase distortion have on an EVM value can individually be evaluated, and such an evaluating method can easily be realized on a communication circuit. In the twelfth embodiment, one of an amplitude distortion and a phase distortion which has a greater effect on an EVM value may be determined, and phase circuit 196 and amplitude circuit 197 may be controlled to correct the determined distortion to a greater extent. For example, one of an amplitude distortion and a phase distortion which is judged as having a smaller effect on an EVM value may not be measured and an EVM value may not be calculated for a certain period of time after the judgment, so that the amount of calculations required to calculate the EVM value is reduced, and the load on the processing circuit is lowered.

In the twelfth embodiment, the circuit for evaluating an EVM value is added to the distortion compensation circuit according to the pre-distortion process. However, the present invention is not limited to such an arrangement. The circuit for evaluating an EVM value may be added to another distortion compensation circuit, e.g., a distortion compensation circuit according to the feedback process or the feed-forward process. Details of the feedback process and the feed-forward process, as well as the pre-distortion process, are described in the above document by Steve C. Cripps.

According to the ninth through twelfth embodiments of the present invention, as described above, since EVM evaluation can be performed by a simple arrangement which does not require a demodulator compatible with a predetermined modulating process, the selection of a modulating process or the compensation for a distortion depending on an EVM value can be carried out by a small-size, inexpensive circuit.

According to the ninth through twelfth embodiments of the present invention, furthermore, the communication circuit confirms whether the EVM value standards are satisfied at a desired output level or not, and if the EVM value standards are not satisfied, the communication circuit improves the situation. Therefore, the reliability of the communication quality is improved more than with the conventional art.

The circuit using the EVM value evaluating method according to the present invention has been illustrated as being applied, for example, to the circuit for changing communication processes based on the evaluated EVM value according to the ninth embodiment, or the circuit for compensating for distortions based on the evaluated EVM value according to the tenth, eleventh, and twelfth embodiments. However, the present invention is not limited to those arrangements. The EVM value evaluating method according to the present invention and the circuit using the EVM value evaluating method can also be used for various other purposes. For example, a circuit for evaluating an EVM value may be used only for evaluating an EVM value on a communication circuit. Though the circuits according to the ninth, tenth, eleventh, and twelfth embodiments have individually been illustrated as an EVM value evaluating circuit, their functions may be applicable in any desired combinations. Transmitting circuits 192$a$, 192$b$, 192$c$, 192$d$ are constructed respectively as shown in FIGS. 19, 21, 24, and 27. However, the circuits included in transmitting circuits 192$a$, 192$b$, 192$c$, 192$d$ may be mounted on a single die or separately on a plurality of dies.

In the ninth, tenth, eleventh, and twelfth embodiments, the EVM value evaluating method has been illustrated as being applied to a transmitting circuit. However, the present invention is not limited to such an application, but may be applied to a receiving circuit. Generally, distortions, rather than noise, are primarily responsible for degrading an EVM value in the transmitting circuit, whereas noise, rather than distortions, is primarily responsible for degrading an EVM value in the receiving circuit. Consequently, the EVM evaluating circuit is often more effective when applied to the transmitting circuit.

While the method of evaluating a linear index EVM has been described above, a value obtained by substituting an EVM value produced by the evaluating method according to the present invention in x of a monotonically increasing or decreasing function f(x) may be evaluated, or may be used as a control index. For example, an EVM value is in monotonically increasing or decreasing relationship to a carrier to interference ratio (CIR) or a bit error rate (BER) (see JP-A No. 2004-56499). Consequently, the relationship between an EVM value and a CIR or a BER may be determined by measurement, simulation or the like, and a CIR or a BER may be calculated from an EVM value obtained by the EVM value evaluation.

If an index calculated from an EVM value is an index which is not limited to a CIR or a BER, but whose relationship to the EVM value, is determined, then the index can be evaluated based on the relationship. The method of evaluating another index from an EVM value determined by the EVM value evaluating method according to the present invention is easily applicable to the circuit simulators according to the fifth and sixth embodiments and the evaluating devices according to the seventh and eighth embodiments, for example. The communication circuits according to the ninth, tenth, eleventh, and twelfth embodiments are capable of performing a control process of changing communication processes and compensating distortions, using another index instead of an EVM value. For example, since the square of an EVM value according to the equation (10) is in conformity with the integral in the equation (10), if the square of the EVM value is used instead of the EVM value as a control index, then the process of calculating the square root required to calculate the EVM value is dispensed with, resulting in a reduction in the amount of calculations.

All the embodiments described above are given by way of example according to the present invention, and should not be construed as being limitative.

The invention claimed is:

1. A linearity evaluating method for evaluating a linear index in a system under test in an electric circuit, comprising the steps of:
    inputting, by an evaluation signal generator, a predetermined evaluation signal to said system under test;
    determining, by an evaluator, at least one of an amplitude distortion and a phase distortion of an output from said system under test to which said evaluation signal has been input;
    performing, by an integration processor, an integrating process on said one of the amplitude distortion and the phase distortion weighted by a probability density function of a power/average power ratio of a predetermined modulated signal; and
    calculating, by a linear index calculator, said linear index from the result of said integrating process.

2. A linearity evaluating method according to claim 1, wherein said phase distortion is not determined, but only said amplitude distortion is determined, and said integrating process is performed using said amplitude distortion.

3. A linearity evaluating method according to claim 1, wherein said amplitude distortion is not determined, but only said phase distortion is determined, and said integrating process is performed using said phase distortion.

4. A linearity evaluating method according to claim 1, further comprising the step of: calculating an error vector magnitude when said modulated signal is used in said system under test, from the result of said integrating process.

5. A linearity evaluating method according to claim 4, further comprising the steps of: determining a residual error vector magnitude of a circuit or a measuring system near said system under test; and calculating a total error vector magnitude representing a combination of said error vector magnitude and said residual error vector magnitude.

6. A linearity evaluating method according to claim 1, wherein said evaluation signal comprises a signal including a component having a carrier frequency of said modulated signal or a frequency close to said carrier frequency.

7. A linearity evaluating method according to claim 6, wherein said evaluation signal comprises a sine-wave signal of said carrier frequency.

8. A circuit simulator for evaluating a linear index in a system under test in an electric circuit, comprising:
    an evaluation signal generator for inputting a predetermined evaluation signal to a model of said system under test;
    an evaluator for determining at least one of an amplitude distortion and a phase distortion of an output from said system under test to which said evaluation signal has been input;
    an integration processor for performing an integrating process on said one of the amplitude distortion and the phase distortion weighted by a probability density function of a power/average power ratio of a predetermined modulated signal; and a linear index calculator for calculating said linear index from the result of said integrating process performed by said integration processor.

9. An evaluating device for evaluating a linear index in a system under test in an electric circuit, comprising:

a measuring device for measuring an input signal input to and an output signal output from said system under test to which a predetermined evaluation signal has been input;

an evaluator for determining at least one of an amplitude distortion and a phase distortion of said output signal, using said input signal and said output signal;

an integrator for performing an integrating process on said one of the amplitude distortion and the phase distortion weighted by a probability density function of a power/average power ratio of a predetermined modulated signal; and a linear index calculator for calculating said linear index from the result of said integrating process performed by said integrator.

10. A communication circuit including a system under test which is to be estimated for a linear index, comprising:

a signal generator for generating a predetermined evaluation signal and inputting the evaluation signal to said system under test;

an evaluating circuit for measuring an input signal input to and an output signal output from said system under test to which said evaluation signal has been input, and determining at least one of an amplitude distortion and a phase distortion of said output signal, using said input signal and said output signal; and a calculator for performing an integrating process on said one of the amplitude distortion and the phase distortion weighted by a probability density function of a power/average power ratio of a predetermined modulated signal, and calculating said linear index from the result of said integrating process.

11. A communication circuit according to claim 10, further comprising: a control circuit for applying said evaluation signal from said signal generator successively to a plurality of said systems under test according to different communication processes, and selecting one of said systems under test for communicating operation, based on said linear indexes calculated by said calculator respectively for said systems under test.

12. A communication circuit according to claim 10, further comprising: a control circuit for controlling an average power level of said evaluation signal from said signal generator based on said linear index calculated by said calculator.

13. A communication circuit according to claim 10, further comprising: a control circuit for controlling a biasing condition for said system under test depending on said linear index calculated by said calculator.

14. A communication circuit according to claim 10, further comprising: a control circuit for controlling an impedance condition for said system under test depending on said linear index calculated by said calculator.

15. A communication circuit according to claim 10, further comprising: a control circuit for controlling at least one of a phase and an amplitude of said input signal when said input signal is input to said system under test, depending on said linear index calculated by said calculator.

16. A non-transitory computer-readable storage medium storing a program for causing a processor-controlled device to evaluate a linear index in a system under test in an electric circuit, the program causing the device to perform the steps of:

inputting a predetermined evaluation signal to said system under test;

determining at least one of an amplitude distortion and a phase distortion of an output from said system under test to which said evaluation signal has been input;

performing an integrating process on said one of the amplitude distortion and the phase distortion weighted by a probability density function of a power/average power ratio of a predetermined modulated signal; and calculating said linear index from the result of said integrating process.

* * * * *